(12) United States Patent
Doering et al.

(10) Patent No.: US 6,387,185 B2
(45) Date of Patent: *May 14, 2002

(54) PROCESSING CHAMBER FOR ATOMIC LAYER DEPOSITION PROCESSES

(75) Inventors: Kenneth Doering, San Jose; Carl J. Galewski, Aromas; Prasad N. Gadgil, Santa Clara; Thomas E. Seidel, Sunnyvale, all of CA (US)

(73) Assignee: Genus, Inc., Sunnyvale, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 09/764,035

(22) Filed: Jan. 16, 2001

Related U.S. Application Data

(60) Division of application No. 09/225,081, filed on Jan. 4, 1999, now Pat. No. 6,174,377, which is a continuation-in-part of application No. 08/920,708, filed on Aug. 29, 1997, now Pat. No. 5,879,459, and a continuation-in-part of application No. 08/810,255, filed on Mar. 3, 1997, now Pat. No. 5,855,675.

(51) Int. Cl.[7] .............................. C23C 16/00; H05B 3/06
(52) U.S. Cl. ....................... 118/729; 118/715; 118/719; 118/725; 118/728; 219/451.1; 219/465.1; 219/466.1
(58) Field of Search ................................ 118/715, 719, 118/725, 728, 729; 219/465.1, 466.1, 451.1

(56) References Cited

U.S. PATENT DOCUMENTS

| | | | | |
|---|---|---|---|---|
| 5,078,851 A | * | 1/1992 | Nishihata et al. | 204/298.34 |
| 5,294,778 A | * | 3/1994 | Carman et al. | 219/385 |
| 5,516,367 A | * | 5/1996 | Lei et al. | 118/725 |
| 5,582,866 A | * | 12/1996 | White | 427/248.1 |
| 5,855,675 A | * | 1/1999 | Doering et al. | 118/719 |
| 5,879,459 A | * | 3/1999 | Gadgil et al. | 118/715 |
| 5,935,338 A | * | 8/1999 | Lei et al. | 118/725 |
| 6,174,377 B1 | * | 1/2001 | Doering et al. | 118/729 |
| 6,190,732 B1 | * | 2/2001 | Omstead et al. | 427/248.1 |

* cited by examiner

Primary Examiner—Jeffrie R. Lund
(74) Attorney, Agent, or Firm—Donald R. Boys; Central Coast Patent Agency, Inc.

(57) ABSTRACT

A processing station adaptable to standard cluster tools has a vertically-translatable pedestal having an upper wafer-support surface including a heater plate adapted to be plugged into a unique feedthrough in the pedestal. At a lower position for the pedestal wafers may be transferred to and from the processing station, and at an upper position for the pedestal the pedestal forms an annular pumping passage with a lower circular opening in a processing chamber. A removable, replaceable ring at the lower opening of the processing chamber allows process pumping speed to be tailored for different processes by replacing the ring. In some embodiments the pedestal also has a surrounding shroud defining an annular pumping passage around the pedestal. A unique two-zone heater plate is adapted to the top of the pedestal, and connects to a unique feedthrough allowing heater plates to be quickly and simply replaced. In some embodiments the top of the processing chamber is removable allowing users to remove either pedestals or heater assemblies. Or both, through the open top of a processing station. In preferred embodiments the system is adapted to atomic layer deposition processing.

10 Claims, 23 Drawing Sheets

Vertically Stacked Compact ALD Reactor (VESCAR) System

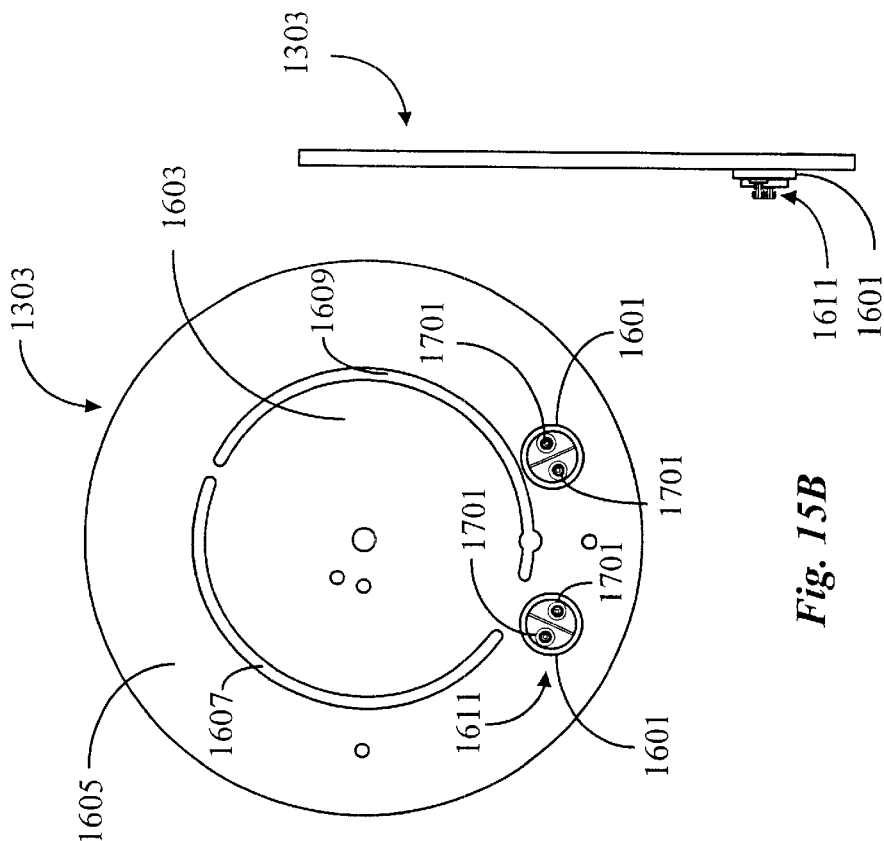
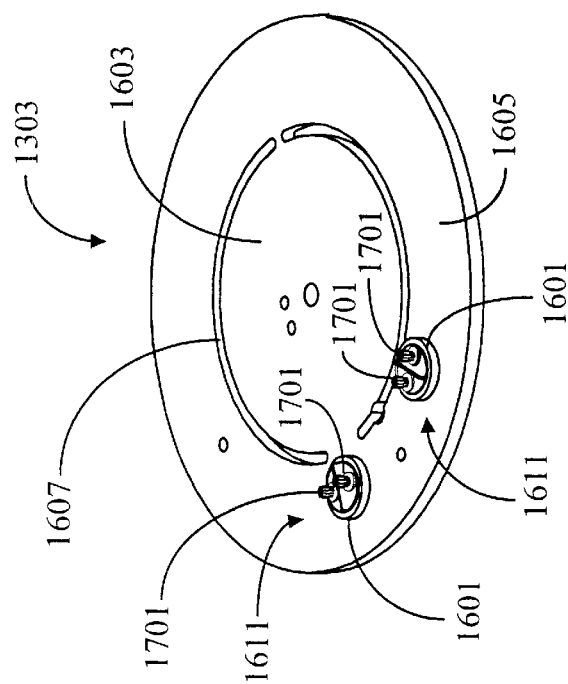
Fig. 15C
Fig. 15B
Fig. 15A

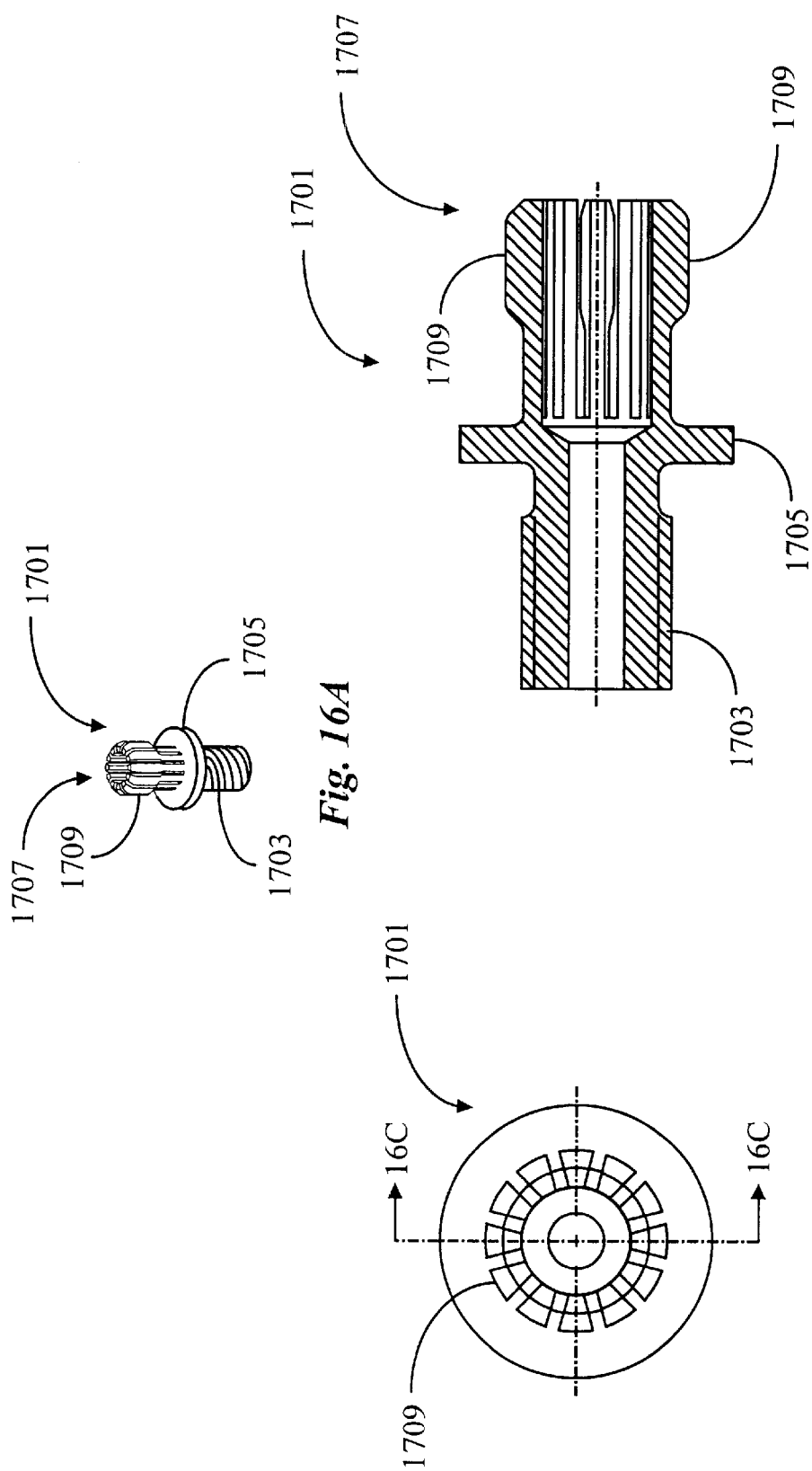

PROCESSING CHAMBER FOR ATOMIC LAYER DEPOSITION PROCESSES

CROSS-REFERENCE TO RELATED DOCUMENTS

This application is a division of Ser. No. 09/225,081 filed Jan. 4, 1999, now U.S. Pat. No. 6,174,377 which is a continuation-in-part of Ser. No. 08/920,708 filed Aug. 29, 1997, now U.S. Pat. No. 5,879,459 and a continuation-in-part of Ser. No. 08/810,255 filed Mar. 3, 1997, now U.S. Pat. No. 5,855,675.

FIELD OF THE INVENTION

This invention is in the field of apparatus and methods for performing Chemical Vapor Deposition (CVD), and relates more particularly to Atomic Layer Deposition (ALD) Processes.

BACKGROUND OF THE INVENTION

In the field of thin film technology requirements for thinner deposition layers, better uniformity over increasingly larger area substrates, larger production yields, and higher productivity have been, and still are, driving forces behind emerging technologies developed by equipment manufactures for coating substrates in the manufacturing of various semiconductor devices. For example, process control and uniform film deposition achieved in the production of a microprocessor directly effect clock frequencies that can be achieved. These same factors in combination with new materials also dictate higher packing densities for memories that are available on a single chip or device. As these devices become smaller, the need for greater uniformity and process control regarding layer thickness rises dramatically.

Various technologies well known in the art exist for applying thin films to substrates or other substrates in manufacturing steps for integrated circuits (ICs). Among the more established technologies available for applying thin films, Chemical Vapor Deposition (CVD) and a variation known as Rapid Thermal Chemical Vapor Deposition (RTCVD) are often-used, commercialized processes. Atomic Layer Deposition (ALD), a variant of CVD, is a relatively new technology now emerging as a potentially superior method for achieving uniformity, excellent step coverage, and transparency to substrate size. ALD however, exhibits a generally lower deposition rate (typically about 100 A°/min) than CVD and RTCVD (typically about 1000 A°/min).

Both CVD and RTCVD are flux-dependent applications requiring specific and uniform substrate temperature and precursors (chemical species) to be in a state of uniformity in the process chamber in order to produce a desired layer of uniform thickness on a substrate surface. These requirements becomes more critical as substrate size increases, creating a need for more complexity in chamber design and gas flow technique to maintain adequate uniformity. For example, a 75 mm substrate processed in a reactor chamber would require less process control relative to gas flow, uniform heat, and precursor distribution than a 200 mm substrate would require with the same system; and substrate size is going to 300 mm dia., and 400 mm. dia is on the horizon.

Another problem in CVD coating, wherein reactants and the products of reaction coexist in a close proximity to the deposition surface, is the probability of inclusion of reaction products and other contaminants in each deposited layer. Also reactant utilization efficiency is low in CVD, and is adversely affected by decreasing chamber pressure. Still further, highly reactive precursor molecules contribute to homogeneous gas phase reactions that can produce unwanted particles which are detrimental to film quality.

Companies employing the RTCVD process and manufacturers of RTCVD equipment have attempted to address these problems by introducing the concept of Limited Reaction Processing (LRP) wherein a single substrate is positioned in a reaction chamber and then rapidly heated with the aid of a suitable radiative source to deposit thin films. Rapid heating acts as a reactive switch and offers a much higher degree of control regarding thickness of films than is possible with some other processes. RTCVD offers advantages over CVD as well in shorter process times, generally lower process costs, and improved process control. At the time of the present patent application RTCVD is a promising new technique for deposition of ultra-thin and uniform films. RTCVD is being steadily introduced into the commercial arena from the R&D stages by a number of equipment manufactures.

Although RTCVD has some clear advantages over general CVD, there are inherent problems with this technology as well, such as the temperatures that are used in processing. Larger surfaces require more critically-controlled temperature, which, if not achieved, can result in warpage or dislocations in the substrate. Also, the challenge of providing a suitable chamber that is contaminant-free and able to withstand high vacuum along with rapid temperature change becomes more critical with larger surface area requirements.

Yet another critical area of thin film technology is the ability of a system to provide a high degree of uniformity and thickness control over a complex topology inherent in many devices. This phenomena is typically referred to as step coverage. In the case of CVD, step-coverage is better than in line-of-sight physical vapor deposition (PVD) processes, but, in initial stages of deposition there can be non-preferential, simultaneous adsorption of a variety of reactive molecules leading to discrete nucleation. The nucleated areas (islands) continue to grow laterally and vertically and eventually coalesce to form a continuous film. In the initial stages of deposition such a film is discontinuous. Other factors, such as mean free path of molecules, critical topological dimensions, and precursor reactivity further complicate processing making it inherently difficult to obtain a high degree of uniformity with adequate step coverage over complex topology for ultra-thin films deposited via CVD. RTCVD has not been demonstrated to be materially better than convention CVD in step coverage.

ALD, although a slower process than CVD or RTCVD, demonstrates a remarkable ability to maintain ultra-uniform thin deposition layers over complex topology. This is at least partially because ALD is not flux dependent as described earlier with regards to CVD and RTCVD. This flux-independent nature of ALD allows processing at lower temperatures than with conventional CVD and RTCVD processes.

ALD processes proceed by chemisorption at the deposition surface of the substrate. The technology of ALD is based on concepts of Atomic Layer Epitaxy (ALE) developed in the early 1980s for growing of polycrystalline and amorphous films of ZnS and dielectric oxides for electroluminescent display devices. The technique of ALD is based on the principle of the formation of a saturated monolayer of reactive precursor molecules by chemisorption. In ALD appropriate reactive precursors are alternately pulsed into a deposition chamber. Each injection of a reactive precursor is separated by an inert gas purge. Each precursor injection provides a new atomic layer additive to previous deposited layers to form a uniform layer of solid film The cycle is repeated to form the desired film thickness.

A good reference work in the field of Atomic Layer Epitaxy, which provides a discussion of the underlying concepts incorporated in ALD, is Chapter 14, written by Tuomo Suntola, of the Handbook of Crystal Growth, Vol. 3, edited by D. T. J. Hurle, © 1994 by Elsevier Science B. V.. The Chapter tittle is "Atomic Layer Epitaxy". This reference is incorporated herein by reference as background information.

To further illustrate the general concepts of ALD, attention is directed to FIG. 1a and FIG. 1b herein. FIG. 1a represents a cross section of a substrate surface at an early stage in an ALD process for forming a film of materials A and B, which in this example may be considered elemental materials. FIG. 1a shows a substrate which may be a substrate in a stage of fabrication of integrated circuits. A solid layer of element A is formed over the initial substrate surface. Over the A layer a layer of element B is applied, and, in the stage of processing shown, there is a top layer of a ligand y. The layers are provided on the substrate surface by alternatively pulsing a first precursor gas Ax and a second precursor gas By into the region of the surface. Between precursor pulses the process region is exhausted and a pulse of purge gas is injected.

FIG. 1b shows one complete cycle in the alternate pulse processing used to provide the AB solid material in this example. In a cycle a first pulse of gas Ax is made followed by a transition time of no gas input. There is then an intermediate pulse of the purge gas, followed by another transition. Gas By is then pulsed, a transition time follows, and then a purge pulse again. One cycle then incorporates one pulse of Ax and one pulse of BY, each precursor pulse separated by a purge gas pulse.

As described briefly above, ALD proceeds by chemisorption. The initial substrate presents a surface of an active ligand to the process region. The first gas pulse, in this case Ax, results in a layer of A and a surface of ligand x. After purge, By is pulsed into the reaction region. The y ligand reacts with the x ligand, releasing xy, and leaving a surface of y, as shown in FIG. 1a. The process proceeds cycle after cycle, with each cycle taking about 1 second in this example.

The unique mechanism of film formation provided by ALD offers several advantages over previously discussed technologies. One advantage derives from the flux-independent nature of ALD contributing to transparency of substrate size and simplicity of reactor design and operation. For example, a 200 mm substrate will receive a uniform layer equal in thickness to one deposited on a 100 mm substrate processed in the same reactor chamber due to the self-limiting chemisorption phenomena described above. Further, the area of deposition is largely independent of the amount of precursor delivered, once a saturated monolayer is formed. This allows for a simple reactor design. Further still, gas dynamics play a relatively minor role in the ALD process, which eases design restrictions. Another distinct advantage of the ALD process is avoidance of high reactivity of precursors toward one-another, since chemical species are injected independently into an ALD reactor, rather than together. High reactivity, while troublesome in CVD, is exploited to an advantage in ALD. This high reactivity enables lower reaction temperatures and simplifies process chemistry development. Yet another distinct advantage is that surface reaction by chemisorption contributes to a near-perfect step coverage over complex topography.

Even though ALD is widely presumed to have the above-described advantages for film deposition, ALD has not yet been adapted to commercial processes in an acceptable way. The reasons have mostly to do with system aspects and architecture. For example, many beginning developments in ALD systems are taking a batch processor approach. This is largely because ALD has an inherently lower deposition rate than competing processes such as CVD and RTCVD. By processing several substrates at the same time (in parallel) in a batch reaction chamber, throughput can be increased.

Unfortunately, batch processing has some inherent disadvantages as well, and addressing the throughput limitations of ALD by batch processing seems to trade one set of problems for another. For example, in batch processor systems cross contamination of substrates in a batch reactor from substrate to substrate and batch-to-batch poses a significant problem. Batch processing also inhibits process control, process repeatability from substrate to substrate and batch to batch, and precludes solutions for backside deposition. All of these factors severely affect overall system maintenance, yield, reliability, and therefore net throughput and productivity. At the time of this patent application, no solutions are known in the industry to correct these problems associated with ALD technology as it applies to commercial production.

What is clearly needed is a unique and innovative high productivity ALD system architecture and gas delivery system allowing multiple substrates to be processed while still providing attractive throughput and yield, and at the same time using expensive clean-room and associated production floor space conservatively. The present invention teaches a system approach that will effectively address and overcome the current limitations of ALD technology, leading to commercial viability for ALD systems.

SUMMARY OF THE INVENTION

In a preferred embodiment of the present invention an ALD processing station for a cluster tool system is provided, comprising a processing chamber portion having a lower extremity with a first cross-sectional area; a base chamber portion below the processing chamber portion, the base chamber portion having a vacuum pumping port and a substrate transfer port, and a second cross-sectional area below the circular lower extremity of the processing chamber and the vacuum pumping port greater than the first cross-sectional area; a substrate support pedestal having an upper substrate support surface with a third cross-sectional area less than the first cross-sectional area and adapted to the base chamber portion below the transfer port by a dynamic vacuum seal allowing vertical translation; a vertical-translation drive system adapted to translate the substrate support pedestal to place the upper support surface at a processing position substantially even with the lower extremity of the processing chamber, or at a lower transfer position in the base chamber portion above the pumping port and below the transfer port; and a demountable gas supply lid mounted to the processing chamber, the lid for providing gases according to an atomic layer deposition (ALD) protocol. With the substrate support pedestal at the processing position the cross-sectional area of the substrate support pedestal and the larger first cross-sectional are of the form a first pumping passage having a first total effective area determining a fist limited pumping speed from the processing chamber portion through the vacuum pumping port, and with the substrate support pedestal at the lower transfer position, the cross-sectional area of the substrate support pedestal and the larger second cross-sectional area form a second annular pumping passage having a second effective area greater area than the first effective area, allowing a second pumping speed from the processing chamber greater than the first limited pumping speed.

In some embodiments the first cross-sectional area is formed by a replaceable ring, thereby allowing the first pumping speed to be incrementally varied by interchanging replaceable rings having constant outer diameter and differing inner diameter. There may also be an annular shroud surrounding a portion of the substrate pedestal beginning at the upper support surface and extending below the upper support surface, wherein the pumping area of the annular shroud at the height of the upper support surface is substantially equal to the first cross sectional area, such that, with the substrate support pedestal in the processing position the annular shroud mates with the first cross-sectional area constraining all gas flow from the processing chamber to flow within the annular shroud between the annular shroud and the substrate support pedestal.

In preferred embodiments the demountable lid closing an upper extremity of the processing chamber is mounted with a demountable seal, such that the lid and the dynamic vacuum seal may be demounted, allowing the substrate support pedestal to be withdrawn from within the base chamber region upward through the processing chamber region. The demountable lid in preferred embodiments comprises a gas distribution system for providing processing gases evenly over an exposed surface of a substrate supported on the substrate support pedestal with the substrate support pedestal in the processing position.

In some cases the substrate support pedestal comprises a closure plate parallel with the upper support surface and forms a vacuum boundary for the processing chamber, a heater plate on the processing chamber side thermally-insulated from the closure plate, and an electrically-isolated susceptor spaced-apart from and above the heater plate, the susceptor forming the upper support surface. The heater plate may be a composite heater plate having at least two separately-powered heating regions, allowing temperature profile across the plate to be managed by managing power to the separately-powered regions. In these aspects the inner heating region is separated from the outer heating region by at least one groove substantially through the heater plate. In a preferred embodiment the inner heating region has a cross-sectional are substantially equal to the cross-sectional area of a substrate to be heated by the heater plate. In some preferred cases the dynamic vacuum seal is a stainless steel bellows.

The present invention in its various embodiments provides a flexible and effective way t accomplish ALD processing on semiconductor wafers, and the various aspects of the invention are taught below in enabling detail.

BRIEF DESCRIPTION OF THE DRAWINGS

FIG. 15A is an isometric view of a two-zone heater plate in an embodiment of the present invention.

FIG. 15B is a plan view of the heater plate of FIG. 15A.

FIG. 15C is side view of the heater plate of FIG. 15A.

FIG. 16A is an isometric view a connector post in an embodiment of the present invention.

FIG. 16B is an end view of the connector post of FIG. 16A.

FIG. 16C is a section view of the connector post of FIG. 16A and FIG. 16B.

DESCRIPTION OF THE PREFERRED EMBODIMENTS

Figure 1A:
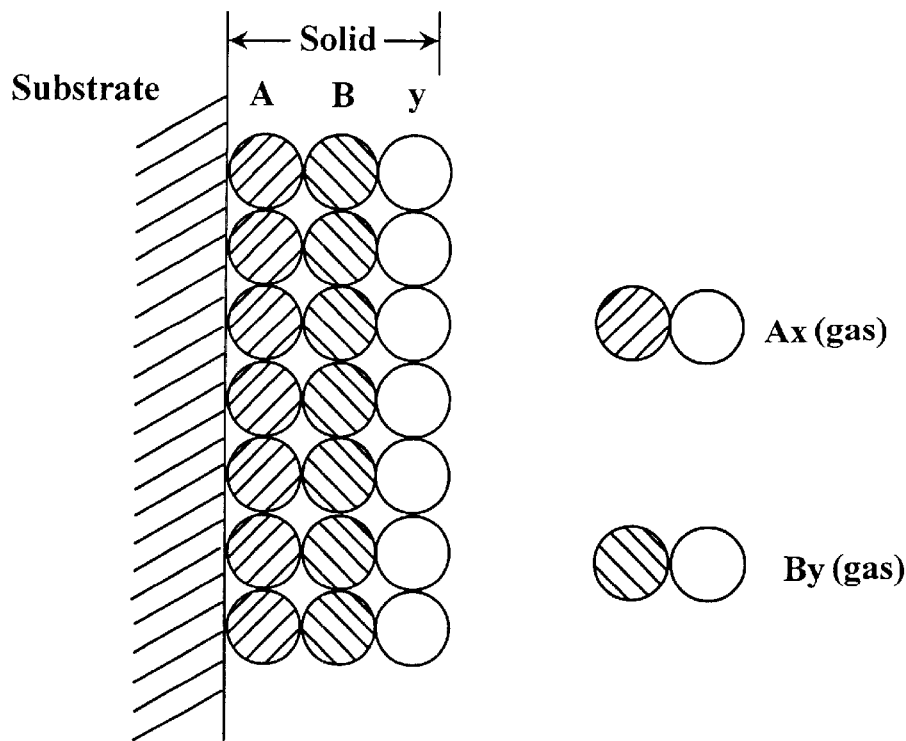
FIG. 1a is a schematic illustration of a generic atomic layer deposition process.

An Atomic Layer Deposition System Using Individual, Stackable Modules

In contemplating commercialization of atomic layer deposition technology, batch-type ALD systems, meaning systems generally wherein substrates to be coated are arranged in different planes, and wherein relatively large numbers of substrates are coated in a single reactor simultaneously, have been seen as attractive from the point of view of throughput, but these sorts of large batch systems are seen by the present inventors to have several serious drawbacks compared to a compact low-profile system having a single gas presentation path, as taught in several embodiments below. Among these difficulties are:

(a) Gas pulsing in a batch system cannot be as rapid and as sharp as may be done in a compact single substrate system.

(b) Backside deposition is difficult to prevent in multi-substrate systems. To prevent backside deposition individual substrates need to be clamped on a dedicated heater, including such apparatus as electrostatic chucks.

(c) Plasma cleaning has been found to be ineffective in large batch systems, as compared to single substrate systems. In situ plasma cleans allow the realization of a very long time between maintenance cleaning.

(d) Gas depletion effects can be a severe process limitation in batch process reactors and are difficult to address in batch systems.

(e) Batch processors are less flexible than single substrate systems for process control, substrate-to-substrate repeatability, process variation, and maintenance. Batch processors also cannot be easily matched to relatively small footprint clustering architecture configurations.

For these and other reasons the present inventors have developed a unique approach to ALD processing comprising a low-profile compact ALD reactor (LP-CAR), which reduces both internal volume and external height, and allows for fast gas switching and enhanced process control, as well as for a unique system architecture. The unique architecture enabled comprises a vertically-stacked multi-unit system, adaptable to clustering schemes for serial integration.

In embodiments described below, the inventors teach a unique low-profile compact reactor, and unique system architectures for use of the ALD reactor in production, which addresses and solves limiting features of batch-types ALD systems.

In the unique design of the LP-CAR in embodiments of the present invention, high throughput is enhanced through fast gas switching promoted in part by minimized internal process volume of the reactor relative to the surface area presented to be coated in the reactor. While length and width of a single-substrate reactor are dictated by the maximum substrate size to be accommodated, typically at about 1.5 times the substrate diameter (if the substrate is round), the internal height of the reactor is the controlling dimension for internal volume. In embodiments of the invention herein, the inventors have also recognized an advantage of having a single, unimpeded gas presentation path to substrate surface to be coated, which generally calls for surface to be coated to presented in a common plane.

Boundary layer conditions and proper gas flow must be achieved, and it is desirable to have alternative plasma lid designs. The ALD process also requires a substrate heater in the process volume to heat substrates during processing, and additionally there are specific requirements for gas delivery and gas exhaust subsystems. Given all of these requirements, in embodiments of the present invention, a low-profile, compact ALD reactor (LP-CAR) suitable for single substrate processing is provided. In embodiments of the present invention described below, low-profile is defined as the height of a reactor as opposed to horizontal dimensions. The ratio of height of an LP-CAR to horizontal dimensions in different embodiments of the invention can vary, depending on specific system requirements. The ratio of height to horizontal dimensions, however, in embodiments to follow is typically less than 1, and can be as low as 0.2. A ratio of about 0.65 is more common for embodiments described herein.

In embodiments of the invention the LP-CARS are independently-controllable reactors, and may be used as building blocks in a unique architecture to address throughput requirements and desirable flexibility in processing sequence. LP-CARS in preferred system embodiments are vertically stacked, which promotes efficient use of precious process real estate. The vertically-stacked architecture is termed by the inventors VESCAR™ for vertically-stacked compact ALD reactor.

In some embodiments taught in enabling detail below, the VESCAR system can be a stand-alone configuration, wherein substrates are provided to and accepted from the VECAR unit through a cassette load-lock subsystem. In other embodiments one or more load locks and one or more VESCAR units are interfaced to a cluster tool handling system, which may also comprise processing subsystems other than ALD, such a CVD, PVD, cleaning, lithography, and others.

Figure 2:
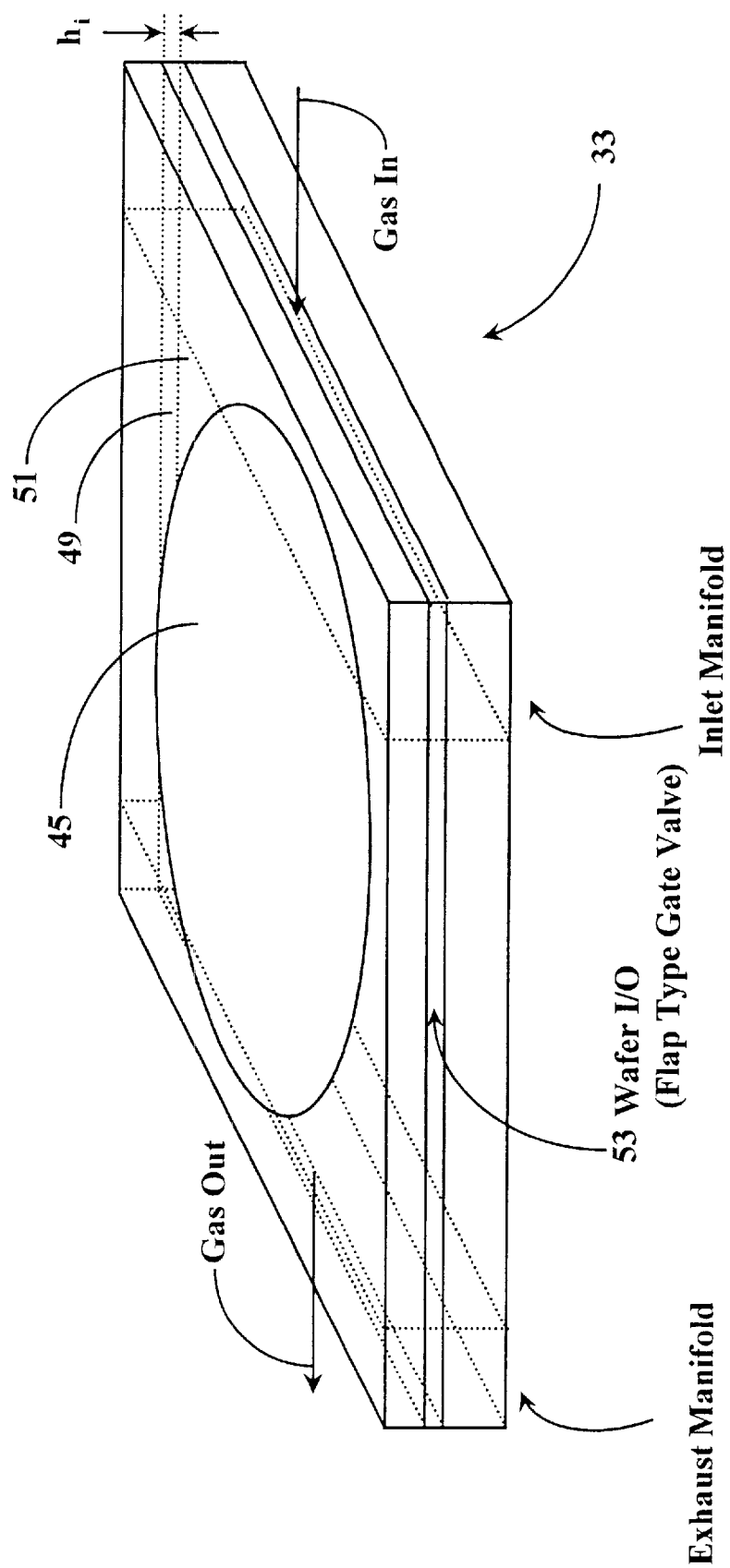
FIG. 2 is an isometric view of a low-profile compact reactor unit according to an embodiment of the present invention.

FIG. 2 is a mostly diagrammatical isometric view of a compact reactor unit 33 according to an embodiment of the present invention, having substrate surface to be coated presented in substantially a single plane, and a single gas flow path to the substrate surface. A substrate I/O (in/out) opening 53 on one side of the reactor unit in a preferred embodiment of the invention is equipped with a gate valve, as described above, and as is described more fully below.

Figure 1B:
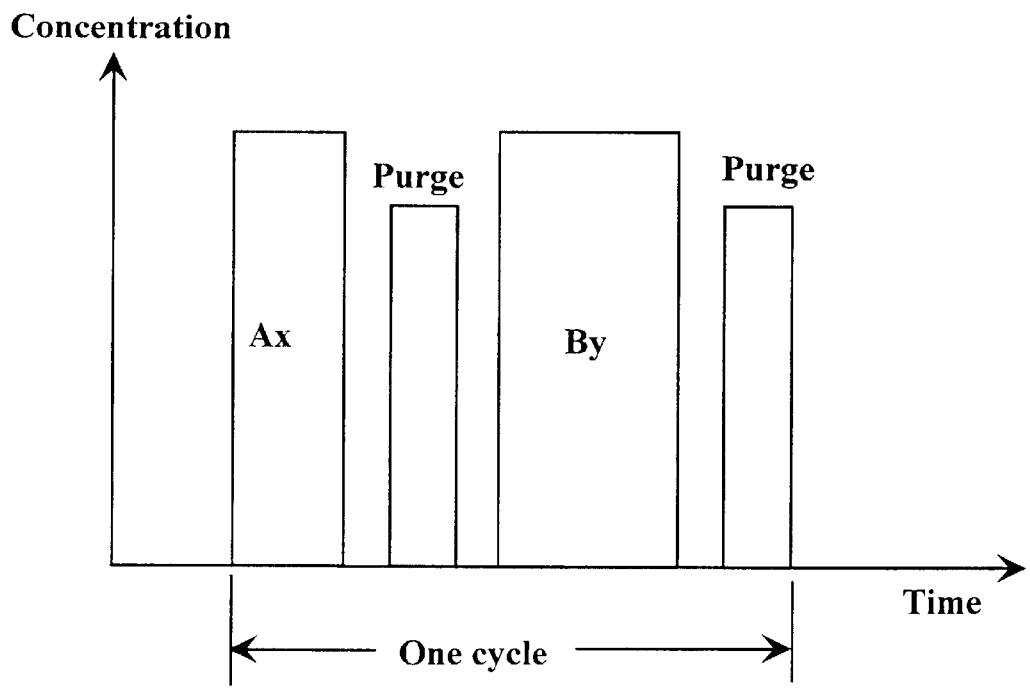
FIG. 1b is a typical timing diagram for ALD gas pulsing.

Gas flow over a loaded substrate 45 in position to be processed is in a horizontal direction substantially parallel to the surface of substrate 45 upon which deposition is to take place, entering from one side (gas in) and exiting an opposite side (gas out). Precursors (chemical species) are alternately pulsed into reactor unit 33 followed by a gas purge, as described relative to FIG. 1b above. In this embodiment the gas flow is from right (gas in) to left (gas out) as represented by directional arrows in the figure. In another embodiment the gas flow may be from left to right In one embodiment the individual compact reactor has an inlet and an exhaust manifold built into the reactor body.

Compact reactor unit 33 may be constructed from any suitable material known in the art such as stainless steel, aluminum, composite graphite, or other materials deemed appropriate for sustaining an applied vacuum and providing suitable characteristics as known in the art for deposition chambers. In one embodiment, reactor unit 33 may be reinforced with structural ribs for the purpose of adding strength under vacuum. Compact reactor unit 33 in the embodiment shown has an overall height h and is of a width and depth so as to accommodate at least a single substrate for deposition. Scaling may be done for substrates of different sizes, from very small up to as much as 400 mm. Diameter or more.

The actual height of the substrate hold area 49 expressed as $h_i$, in terms of the horizontal dimensions, is a is a very important parameter, as this height helps define the internal volume of a reactor wherein gas pulsing and processing takes place. The external height is controlled to provide a low-profile to facilitate stacking of reactors, as briefly described above, in a system architecture to be described fully below. The internal height of the reaction region in an LP-CAR unit according to embodiments of the present invention is separately controlled to provide a practical minimal volume relative to substrate surface area to be coated, which maximizes gas utilization and enhances fast gas switching. In more general terms, the critical issue discovered by the present inventors is that speed of gas delivery to the surface to be coated must be maximized, while providing a sufficient quantity of precursor to assure surface saturation, and without an overabundance of gas. This is best accomplished by a reactor internal shape which promotes a uniform cross section in the wave front of advancing gas injected into the reactor, minimizes internal volume, and provides a sufficient clearance in the gas path over the surface to be coated that gas flow to the substrate surface is not impeded.

In an LP-CAR provided for a substrate diameter of 300 mm., the internal height in embodiments of the invention will preferably be about one inch, but can vary somewhat from one embodiment to another. It is preferred by the inventors that the ratio of internal height to horizontal internal dimensions of the reaction region not exceed about 0.25, to insure fast gas switching and efficient precursor utilization.

Retractable substrate lift pins (not shown) in some embodiments are positioned in the bottom surface of substrate hold area 49 for the purpose of supporting the substrate. The number of substrate-lift pins present in substrate hold area 49 is typically three or more and the pins are arranged in a pattern to support the substrate horizontally.

Substrate-lift pins are commonly used for horizontal support of a substrate in a reactor chambers in processes such as RTCVD. In some embodiments, substrate-lift pins are part of a substrate holding tray. In other embodiments, substrate-lift pins are built in to the reactor chamber. Typically, substrate-lift pins come to a point at the substrate surface for the purpose of providing a small heat-sink area and to avoid surface coating anomalies. This rule is more critical in processes that use more heat such as RTCVD, and or in cases where a substrate is processed on both surfaces simultaneously. In some embodiments a flat electrostatic chuck (ESC) with suitable heat capabilities may be used to secure substrates during processing, precluding backside deposition.

Compact reactor unit 33 is heated and cooled during substrate processing. Area 51 represents a heater compartment wherein a heating device such as a resistance-heated coil is housed. Area 47 comprises cooling lines running through the top surface of reactor unit 33. It will be apparent to one with skill in the art that differing chemical species or precursors that are used in various processes may require different temperatures to be maintained inside compact reactor unit 33 during process. Therefore it is intended by the inventors that various heating and cooling methods known in the art of deposition be applicable in various embodiments of the present invention. Similarly, area 51 may house more than one type of heating element as may be required for delivering levels of heat in differing measures of time, as may be required, for example, to do in-situ annealing, and so on.

Figure 3A:
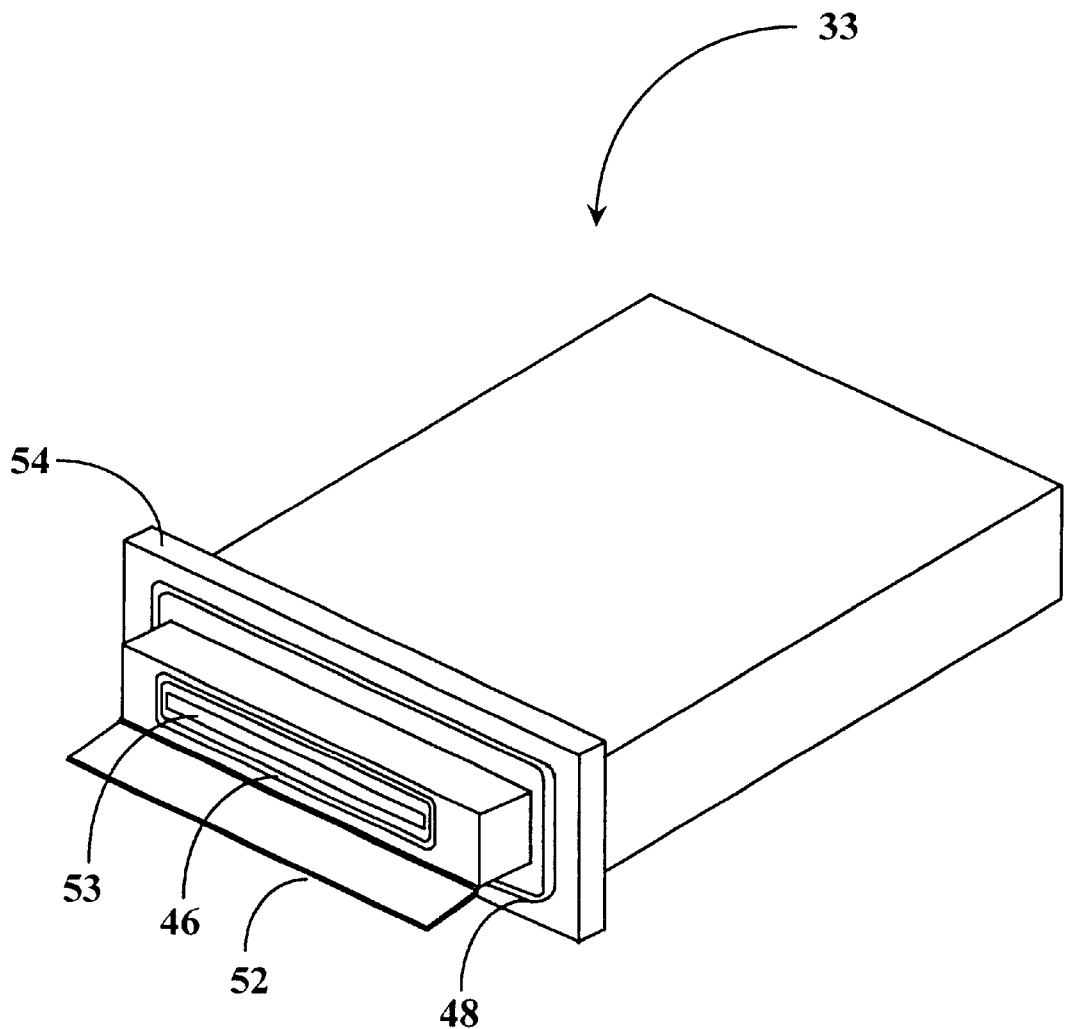
FIG. 3a is an isometric view of the compact reactor unit of FIG. 1 showing a flap-type gate valve and flange according to an embodiment of the present invention.

FIG. 3a is a simplified isometric view of the compact reactor unit 33 of FIG. 2 according to an embodiment of the present invention wherein a flap-type remotely-operable valve 52 is provided to cover and expose opening 53. This valve is closed for processing and open for substrate transfer to and from the LP-CAR. There is in this embodiment a vacuum seal 46 surrounding opening 53, which may be an o-ring in some embodiments, a quad-ring, a metal seal, or other vacuum seal as known in the art. Valve 52 is provided to close against the vacuum seal to isolate the unit in operation. A flange 54 in one embodiment is positioned behind gate valve 52 and also has a vacuum seal 48 provided for sealing against a non-vacuum side of an interface wall of a vacuum chamber in a production architecture to be described in further detail below.

There are various methods that are known in the art for automatic control of gate valves, such as valve 52. In a preferred embodiment of the present invention the gate is a flap-type valve, and a cam-operated electrical mechanism (not shown) is provided and mounted to a wall of reactor unit 33 and also to a pivot arm (not shown) on the valve door. Electrical leads pass through the body of reactor 33 from the non-vacuum side in operation. A variety of mounting schemes may be implemented for mounting a cam-type device for opening and closing gate valve 52 without departing from the spirit and scope of the present invention. Electrically-operated cam devices are common and known in the art as well as to the inventors.

The embodiment represented here is but one example of how LP-CAR 33 may be provided with a gate valve for the I/O opening. In another embodiment a flap-type door may be provided pivoted from above rather than from below. In yet another embodiment, instead of a flap-type door, a cam-operated sliding door may be incorporated. In a preferred embodiment, a flap-type door is used because of simplicity of design and implementation.

It will be apparent to one with skill in the art that the actual shape of flange 54 as well as gate valve 52 may vary considerably without departing from the spirit and scope of the present invention. For example, flange 54 may be of the form of a rounded rectangle or perhaps an elliptical shape. Similarly, gate valve 52 may take other forms than those described above. In some embodiments a sealing interface may be provided without using a flange as an integral part of the reactor body.

Figure 3B:
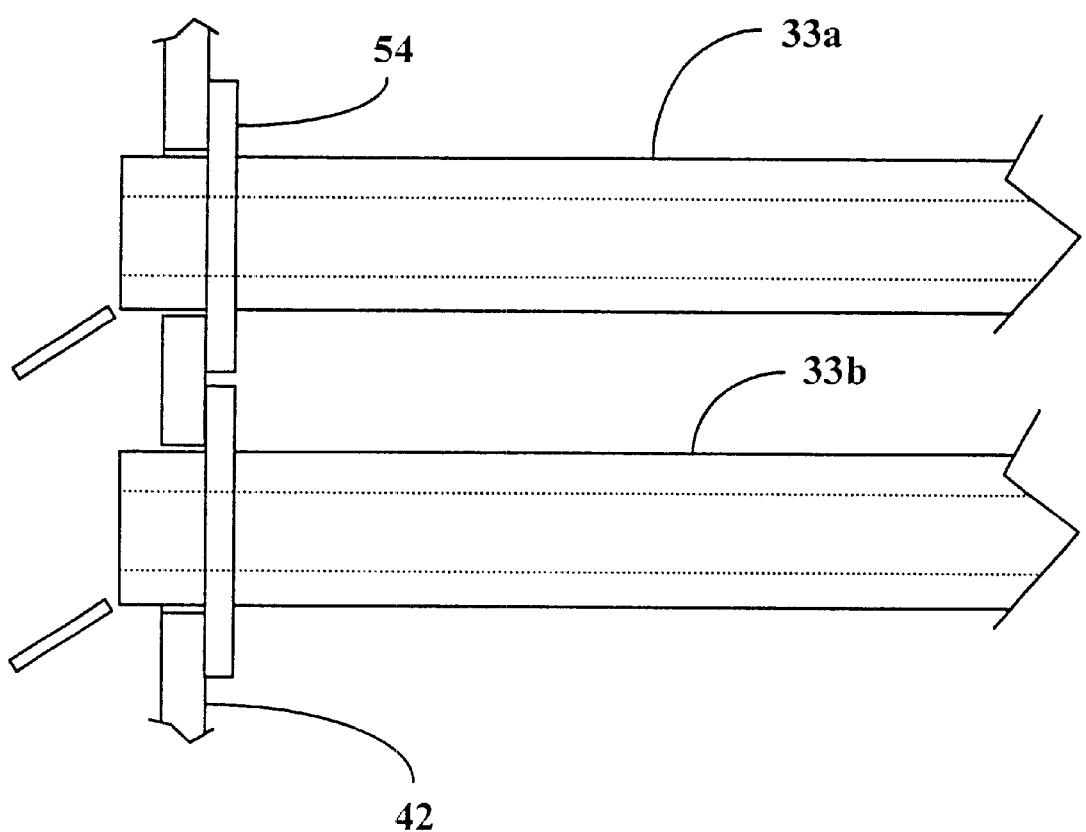
FIG. 3b is a right side view of two compact reactor units as shown in FIG. 1 according to an embodiment of the present invention.

FIG. 3b is a side elevation view of two compact reactor units as described in FIG. 3a according to an embodiment of the present invention, illustrating a vacuum interface that is formed with flange 54 and an interfacing wall 42 of a vacuum chamber. On the non-vacuum side a stacking fixture or rack (not shown in FIG. 3b) is used to support reactor units 33a and 33b and other reactor units not shown in FIG. 3b that may be a part of a VESCAR system according to embodiments of the present invention. It will be apparent to one with skill in the art that a stacking fixture or rack used for supporting and spacing reactor units in a vertical configuration may be constructed from any durable material such as stainless steel, or any other suitable material as long as it can support the individual reactor units and resist dimensional changes that may occur. Fixtures used for positioning one or more components to be interfaced to a shared interface in a system are relatively common and known by persons skilled in the art. The important characteristics for a stacking fixture as in this embodiment of the present invention are that it can equally and accurately space the reactor units, facilitating successful and repeatable transfers of substrates, and that it can support the weight. In one embodiment a fixture in the form of a rack having removable spacers for proper positioning could be used. In another embodiment, accurate spacing may be accomplished via adjusting screws and the like.

In various embodiments spacing of the LP-CAR units in a vertical stack must allow for providing thermal isolation between the lower hot region of each reactor and the upper cool region of each adjacent reactor. Similarly, the topmost and the lowermost LP-CAR in a stack should have a similar thermal environment to the other reactors in a stack.

The area to the left of chamber wall 42 shown in FIG. 3*b* is the vacuum region of a vacuum transfer chamber in a vertically-stacked system described below. Securing flange 54 to the chamber wall can be accomplished by conventional fastening techniques and hardware, such as socket-head screws. In an alternative embodiment, a mating flange may be affixed to the chamber wall, perhaps via welding, so that flange 54 could be clamped to the mating flange thereby completing the interface. In such a case the mating flange may have alignment pins that fit into openings present in flange 54. It will be apparent to one with skill in the art that there are many configurations possible only some of which are described herein.

Figure 4:
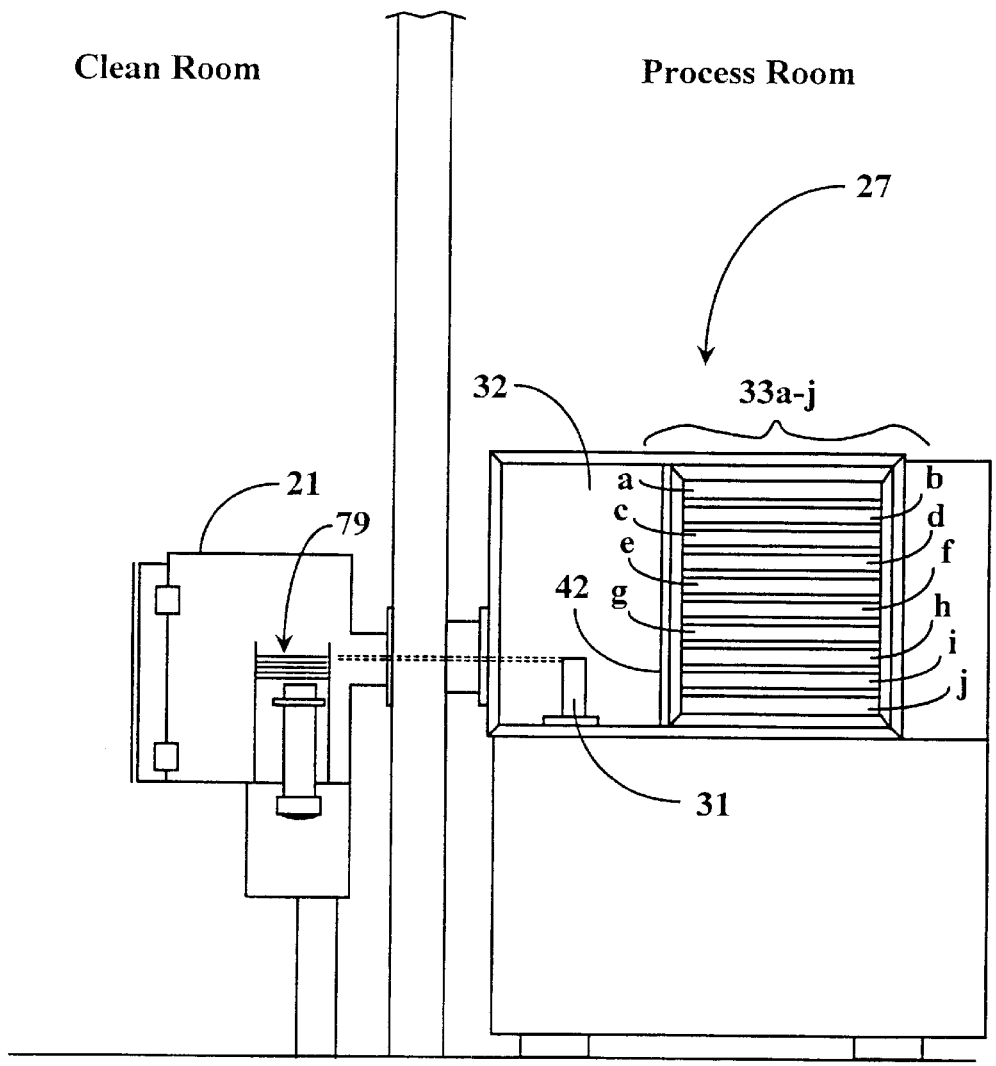
FIG. 4 is an elevation view of VESCAR 27 integrated with a load-lock according to yet another embodiment of the present invention.

FIG. 4 is an elevation view of a VESCAR system 27 interfaced directly to a cassette load lock 21 in a production system embodiment of the present invention. In this embodiment, pre-processed substrates are loaded into cassette load lock. In this architecture a wall separating a clean room environment from a process room has an opening through which cassette load lock 21 and VESCAR unit 27 are interfaced This sort of clean room interfacing is well-known in the art for production systems, to conserve precious clean room space.

VESCAR system 27 comprises a vacuum handling chamber 32 with wall 42 (see also FIG. 3*b*) and a Z-axis robot 31 with horizontal as well as vertical extension capabilities, and is shown here extending into cassette load lock 21. A cassette 79 loaded with preprocessed substrates is positioned so that Z-axis robot 31 can pick up a substrate and move the substrate into VESCAR unit 27. Once inside VESCAR 27, Z-axis robot 31 rotates 180 degrees extends to the proper vertical position for placement of a substrate into a reactor unit, of which 10 (*a–j*) are shown in a vertically stacked architecture interfaced to vacuum wall 42.

Ten LP-CAR units, one-above-another as shown in FIG. 4 is considered by the inventors a practical number to address throughput needs while at the same time conserving real estate. In some embodiments of the present invention there are more than one extension and transfer arm associated with Z-axis robot 31, and/or more than one end effector to avoid any transfer limitations on throughput. Finished substrates are unloaded in reverse order to the loading process described, and the finished substrates are placed back in cassette 79.

The VESCAR architecture of FIG. 4 is a minimum-cost solution, and a starting point for further integration into more sophisticated VESCAR architectures. Also, the architecture shown is a good process research and development configuration for use in developing process sequences and the like using multiple LP-CAR units. Processes developed in the VESCAR system of FIG. 4 may be scaled up to more sophisticated processing schemes to be described below.

Figure 5:
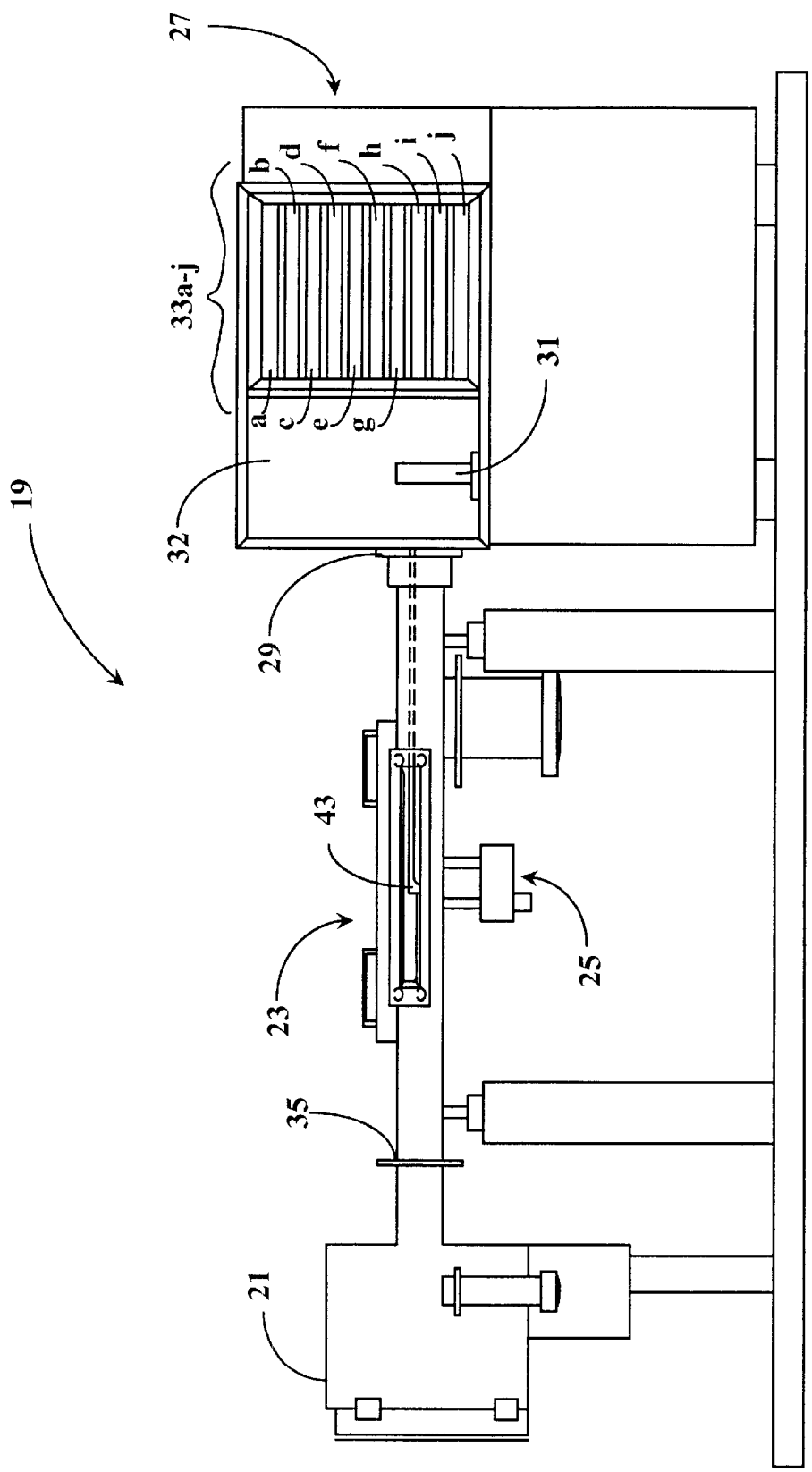
FIG. 5 is an elevation view of an ALD vertically-stacked system architecture according to an embodiment of the present invention.

FIG. 5 is an elevation view of an ALD production system 19 according to an embodiment of the present invention. The unique combination and automation of various components described herein effectively surmount obstacles related to system architectures available with more conventional ALD reactors. Embodiments described and taught below provide substantive solutions to problems such as slow deposition rate, use of scarce production space, and other problems faced with current ALD applications and competing processes.

Referring now to FIG. 5, a (VESCAR) 27 comprises a vacuum chamber 32 having a vertical interface for the attachment of separate compact reactor units 33*a–j*, as also described above with reference to FIG. 4. Compact reactor units 33*a–j* are adapted to sustain suitable vacuum both separately and in integration with vacuum chamber 32. A flap-type gate valve present in each compact reactor unit 33*a–j* allows for separate pump-down (gate closed) and sharing vacuum in vacuum chamber 32 (gate open). Individual provision at each reactor unit allows for vacuum, purge, and flow of process gases, and suitable valving, including the load and unload flap-type valve described above, allows substrates to be transferred to and from the vertically-stacked reactors to and from chamber 32.

It will also be apparent to one with skill in the art that there may be more or fewer compact reactor units stacked vertically and present in VESCAR 27 than the number shown in FIGS. 4 and 5 without departing from the spirit and scope of the invention. In the embodiment described here with reference to FIG. 5, there are 10 compact reactor units 33*a–j*, however, in actual practice of the present invention, as many compact reactor units may be incorporated into VESCAR 27 as may be deemed appropriate for facilitating a high throughput in a competitive manner with respect to known commercial processes. The number is limited as a practical matter by vertical space available, and must be matched by the range of handling equipment dedicated to the purpose.

Z-axis robot 31 is provided in chamber 32 for the automated loading and unloading of substrates with respect to compact reactor units 33*a–j*, and for interfacing with other material-handling equipment. Z-axis robot 31 can extend to vertical and horizontal positions and is programmed to interface with each compact reactor unit 33*a–j*. Z-axis robot 31 can also be programmed in this embodiment to load substrates to reactors in any sequence desired. For example, substrates can be loaded from bottom to top, from top to bottom, from middle to top, and so on. Further, substrates can be unloaded from one compact reactor unit and reloaded to another compact reactor unit. Any sequence is possible. In some embodiments there are multiple substrate handling devices, such as end-effectors and the like, associated with a single Z-axis robot.

Compact reactor units 33*a–j* are interfaced to chamber 32 along one wall of the chamber, and carefully spaced to allow for error-free loading and unloading by the Z-axis robot. The reactors interface to the chamber with a vacuum seal, and are supported by a rack assembly outside chamber 32, as is illustrated below in additional detail with reference to further drawing figures.

In this embodiment a vacuum central robotic substrate handler 23 is interfaced with VESCAR 27 via a gate valve 29. Gate valve 29 is a vacuum valve that allows VESCAR unit 27 to be isolated from the cluster-tool handler between substrate transfers. A transfer mechanism 43 operated through a rotary mechanism 25 loads and unloads substrates to and from Z-axis robot 31. Transfer mechanism 43 in FIG. 1 is shown extended to gate valve 29. In a position 180 degrees from the position shown, transfer mechanism 43 can extend to a cassette load lock 21 where preprocessed substrates are loaded and finished substrates are unloaded. Robotic substrate handling systems of the sort depicted by handler 23 are commercially available from several vendors; among them Brooks Automation, Equipe, and Smart Machines.

In a preferred embodiment of the present invention, preprocessed substrates are first placed into cassette load lock 21 in a vertically oriented cassette or rack (not shown). After the preprocessed substrates are presented in cassette load lock 21, the lock is closed and evacuated to a specified vacuum through a vacuum port (not shown). The transfer volume within robotic handler 23 is also evacuated to a specified vacuum through a vacuum port also not shown. Vacuum chamber 32 is pumped down through a similar vacuum port (not shown). With all units suitable pumped, a gate valve 35 opens to allow transfer mechanism 43 to extend into cassette load lock 21 to retrieve substrates one-at-a-time. A cassette handler (not shown) in cassette load lock 21 can raise or lower a platform which holds a vertical cassette holding the preprocessed substrates.

When transfer mechanism 43 retrieves a substrate, it then retracts to within the robotic handler volume and rotates to a 180 degree position so that it may extend to VESCAR 27. Typically gate 35 closes between transfers, but this is not strictly required in many process-flow schemes. With the transfer mechanism at VESCAR 27, gate valve 29 opens to allow transfer mechanism 43 to pass the substrate through to Z-axis robot 31. Z-axis robot 31 then receives and loads the substrate into one or another of the vertically-stacked compact reactor units, and so on.

Many operating schemes are possible. In the architecture shown one preferred scheme is to adapt the system with an equal number of compact ALD reactors as positions in a load-unload cassette 21. Transfer continues until all substrates from load lock 21 are transferred to reactor units (all reactor units then having each a substrate to be coated), then intervening valves close, and processing commences in reactor units 33a–j. This system has the processing steps of a batch system while all substrates are processed in individually-isolated reactor units Many other schemes are possible. Because each compact reactor has an isolation gate valve, in some schemes reactor processing commences as soon as a substrate is loaded. Other process flow schemes will be apparent to those with skill in the art.

In one embodiment, as individual pumping and isolation is provided for chamber 32, at the time that reactors are loaded and before processing begins in the reactor units, pressure is increased in chamber 32, by bleeding in an inert gas, to a level sufficient to provide a pressure differential across the flap-type valves of the individual reactors, proving additional sealing force to the individual reactor valves than would otherwise be possible.

After all of the processes have been performed in compact reactor units 33a–j, flap type gate valves (FIG. 3a element 52) installed in each unit can be opened to allow substrates to be unloaded in a reverse process from that described above with reference to loading. One by one, finished substrates are returned typically to the same cassette from whence the substrates were retrieved. Lock 21 may then be vented with valve 35 closed, and a cassette load of finished substrates may be removed. This processing is wholly automated from the point of leaving the preprocessed substrates in cassette load lock 21 to picking up the finished substrates in cassette load lock 21. Timing features related to gate valve opening, speed of delivery, length of process or processes (including sequence of processes), pump down sequences, and other required commands are programmable functions of controlling software and hardware according to techniques generally known in the art.

Due in part to the flux-independent nature of the ALD process, wherein layers are formed on the deposition surface by chemisorption as described above, and as is known in the art, compact reactor units such as compact reactor units 33a–j can be designed so as to have a width that will receive substrates of optimum size such as 300 mm substrates. Also, smaller substrates could be processed in the same system without scaling down the size of compact reactor units 33a–j. In another embodiment, a scaled-down system could be implemented for the purpose of processing smaller substrates one-at-a-time, or a scaled-up version could be provided for other products such as flat panel displays and so on.

Figure 6:
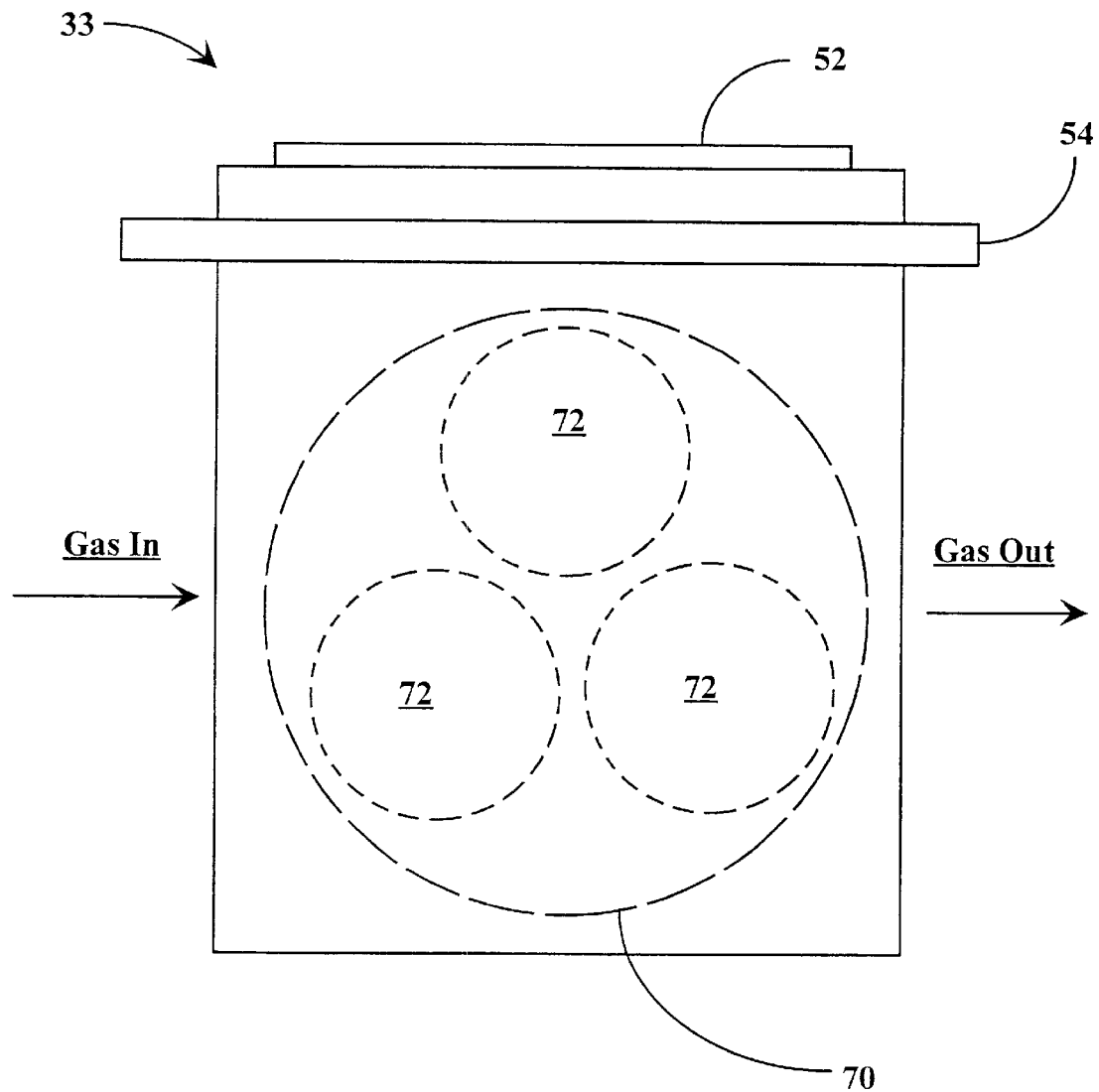
FIG. 6 is a plan view of an LP-CAR according to an embodiment of the present invention adapted for processing multiple substrates in a single LP-CAR unit.

In some embodiments of the present invention, an LP-CAR developed for a particular substrate size, as mentioned in the paragraph just above, may be adapted for processing multiple substrates of smaller size. FIG. 6 is a plan view of an LP-CAR 33 of the type shown in FIG. 3a with the nominal substrate size shown as a dotted circle 70. An LP-CAR unit in alternative embodiments of the invention may be adapted to process, for example, three substrates 72 smaller than substrate 70 in LP-CAR unit 33. In some embodiments unit 33 may be provided with a rotary chuck so substrates 72 may be placed and retrieved at a common transfer point. In other embodiments the robotic transfer devices may be adapted to place the substrates at the desired locations on a hearth. In yet other embodiments multiple substrates may be handled in a common carrier transferred to and from an LP-CAR unit. This allows for use of the single-substrate LP-CAR design with multiple substrates in the same process plane.

The unique architecture described above provides a wholly automated commercial ALD process not previously available with current art. By utilizing VESCAR 27, a high process throughput can be accomplished comparable to throughput provided with competing technologies such as CVD, PECVD, and the like. Also, because of the inherent uniformity improvements attainable through the ALD process, and the fact that separate reactor units are used in place of batch technology, higher yields can be realized without the problems associated with cross contamination and the like. And in achieving these advantages, scarce production floor space is used very conservatively, due to the vertical stacking of compact units.

The embodiment described with the aid of FIG. 5 represents but one example of many possible arrangements of equipment that could be utilized with VESCAR 27. While there is only one cassette load lock 21 and one VESCAR 27 shown in this embodiment, there are two additional positions on robotic handler 23 to which additional load locks or VESCAR units may added. Further detail regarding the addition of equipment as described above will be provided in an additional embodiments below.

Figure 7:
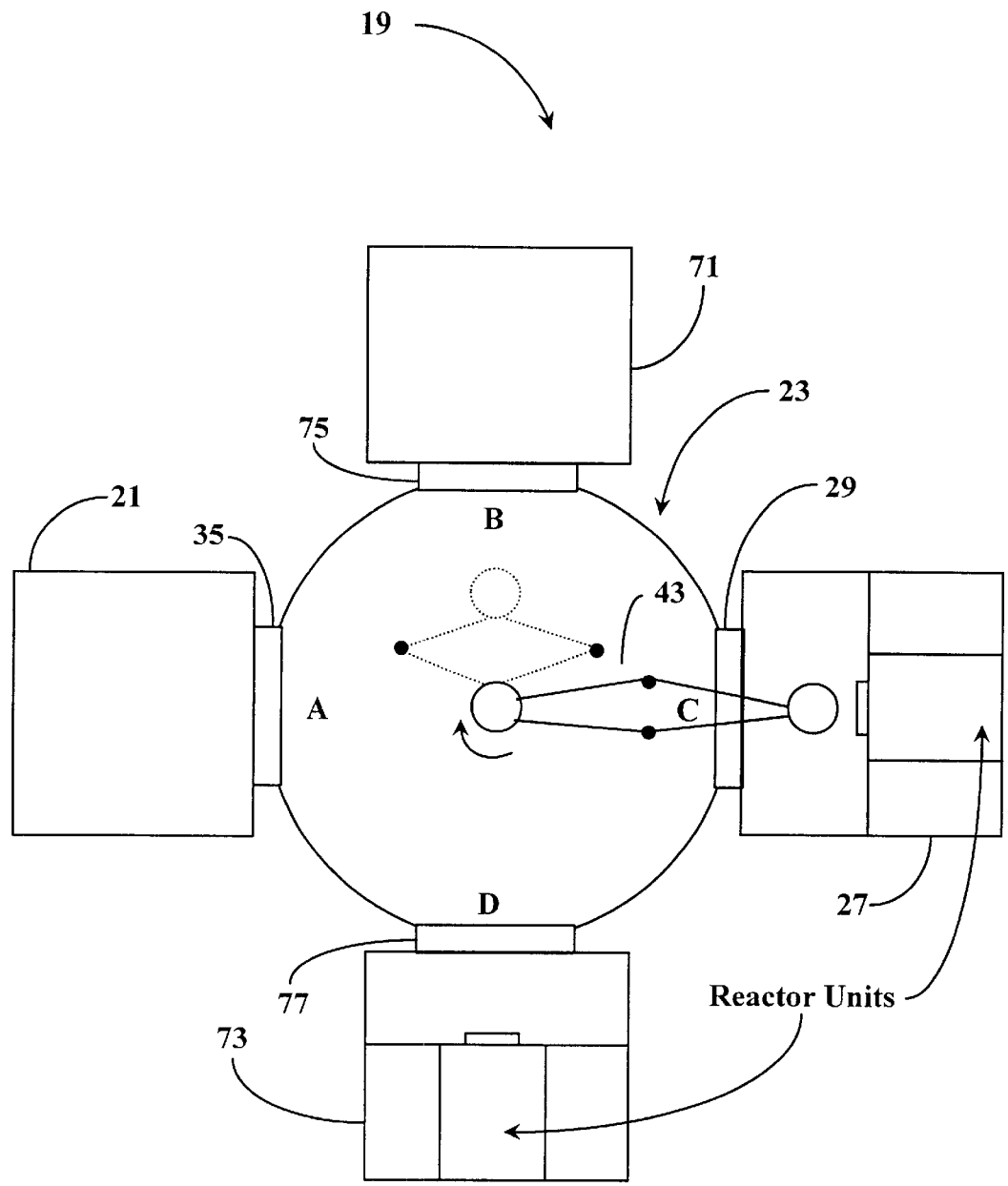
FIG. 7 is a top view of production system 19 according to an alternate embodiment of the present invention.

FIG. 7 is a top view of production system 19 of FIG. 5 according to an alternative embodiment of the present invention wherein additional VESCAR units or cassette load locks may be interfaced with robotic handler 23 for the purpose of running additional processes, such as CVD, cleaning, and the like. Robotic handler 23 has four 90 degree positions illustrated as positions A, B, C, and D in FIG. 7. Position A is connected to gate valve 35 and cassette load lock 21 also described with reference to FIG. 5. Position B is connected to a gate valve 75 and a cassette load lock 71. Position C is connected to gate valve 29 and VESCAR unit 27 also described with reference to FIG. 1. Position D is connected to a gate valve 77 and a second VESCAR unit 73. Transfer mechanism 43 is controlled by operating unit 25 of FIG. 5 whereby transfer mechanism 43 is rotated to achieve each position. In FIG. 7 mechanism 43 is shown extended at position C with a loaded substrate in a position to be received in VESCAR unit 27. Gate valve 29 is in open position allowing transfer of the substrate. Transfer mechanism 43 is also shown in a retracted position (illustrated by dotted lines) and oriented to gate valve 75 and cassette load lock 71 in position B. In this example the transfer mechanism has taken a substrate from cassette load lock 71 and placed it in VESCAR unit 27. Transfer mechanism 43 operates in a like fashion with respect to all four positions illustrated in that extension, retraction, rotation and extension are performed in order to successfully transfer substrates from load locks to VESCAR units and back to load locks.

In one embodiment, three VESCAR units and one cassette load lock may be utilized wherein different parallel processes (all reactor units in one process module dedicated to one process) are being performed in each process module. Similarly, serial processing (each reactor unit in one process module dedicated to a different process) can also be performed. In another embodiment, one process module may be dedicated to serial processing whereas another process module is dedicated to parallel processing with the system incorporating two cassette load locks. It will be apparent to one with skill in the art that there are many processing configurations that could be utilized in production system 19 without departing from the spirit and scope of the present invention several of which have already been described above.

Figure 8:
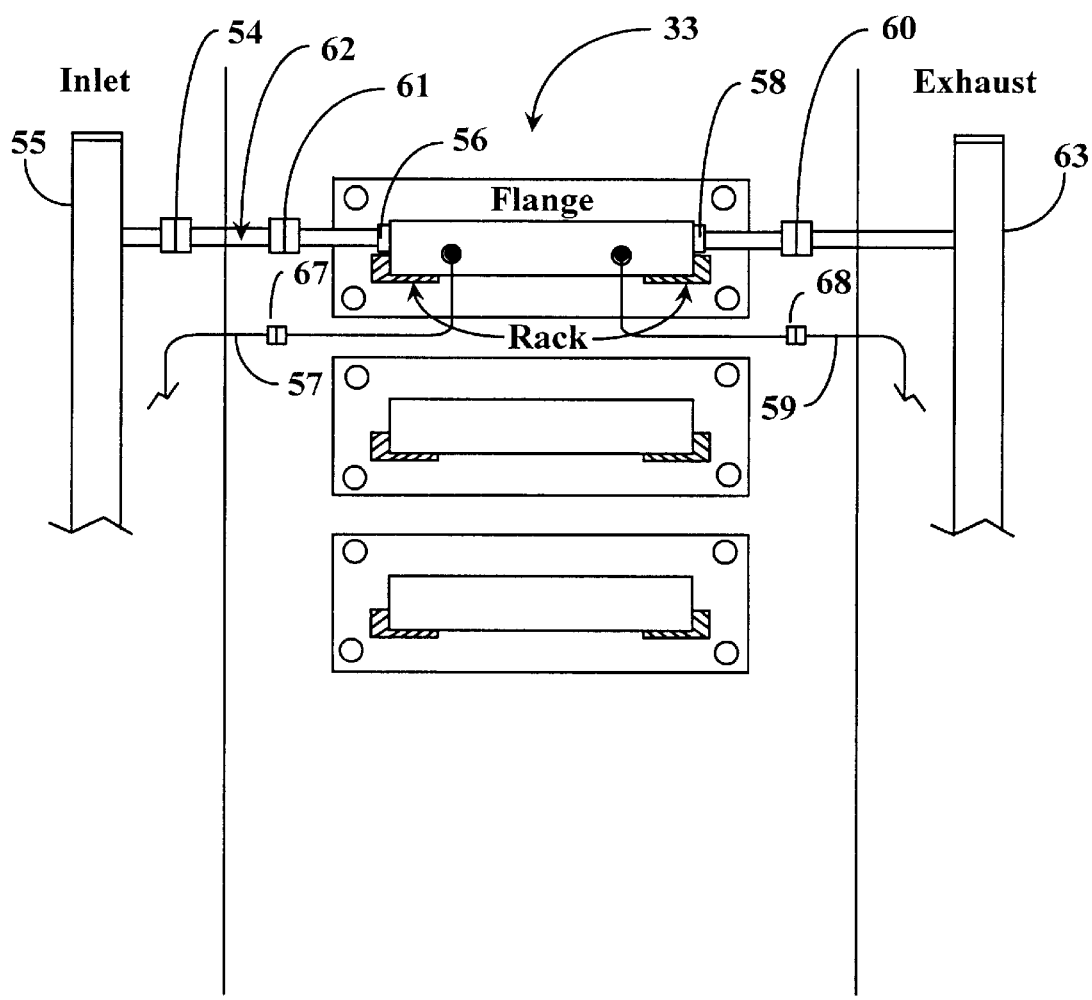
FIG. 8 is an elevation view of the stacked compact reactor unit of FIG. 1 viewed from the rear according to an embodiment of the present invention.

FIG. 8 is a rear view of VESCAR system 27 showing three of the ten vertically stacked reactor units interfaced to chamber wall 42 according to an embodiment of the present invention. A vertically-oriented gas inlet manifold 55 is shown on one side of the vertically-stacked reactor units for providing a gas or vapor material to the reactors. In a preferred embodiment of the present invention, multiple precursors and inert gases may be alternately pulsed into reactor unit 33 during processing, but only one manifold 55 is shown in this figure to avoid confusion in the drawing. In actual practice of the present invention one manifold is used for each precursor gas or vapor and at least one for purge gas. Therefore, a minimum of three manifolds would typically be used.

In a preferred embodiment of the invention a valved charge tube is used to control quantity of supply to each reactor for each gas or vapor provided. In FIG. 8 one such charge tube 62 is shown. These separate charge tubes are of a predetermined volume and are charged with gas or vapor of controlled pressure and temperature so the number of molecules of gas or vapor is known Each charge tube is isolated by two valves, which, in the case of tube 62 are charge valve 54, and injection valve 61. Upon opening injection valve 61, the charged content of that section of tubing is discharged into reactor unit 33. Opening charge valve 54 with injection valve 61 closed allows the charge tube to be filled with a precursor gas, vapor, or purge gas at a predetermined pressure and temperature.

A quick-connect flange 56 is used to connect the gas and precursor source to reactor unit 33, and other quick connects may be provided to allow for relatively quick release of all gas and vapor lines to and from each reactor unit. The pulsing of precursors and gas purging is done in a sequential manner as required for an ALD sequence. The time of individual pulses is typically very short (approximately 50 to 300 milliseconds depending on the process), and pulses are typically separated by a short transition time. For this reason valves of a fast switching nature are incorporated. Fast switching valves are well known in the art and to the inventors.

A vertically-oriented vacuum exhaust manifold 63 is connected to the right side of reactor unit 33 in this embodiment via a quick connect fitting 58 for the purpose of exhausting gases and vapors from the reactor chambers. The use of quick connects is meant to facilitate removal and service of individual reactors. Quick connects, as such, are known in the art and are available in a variety of shapes and configurations. A vacuum shut off valve 60 is provided for facilitating repair or replacement. This valve will be typically open during gas pulsing.

Power is provided to reactor unit 33 via representative electrical lines 57. Power is provided for powering various elements such as gate valve 52 of FIG. 3B, heating sources and the like. Control signals are provided for such as valves and are provided via representative control lines 59. Electrical connectors 67 and 68 are provided in electrical lines such as lines 57 and 59 for the purpose of facilitating quick removal of reactor unit 33.

As described with reference to FIG. 2, substrates typically must be heated during processing and cooled after processing. Therefore, connections are also provided for liquid cooling. Cooling systems that recycle coolant are common in cooling reactors. Such systems are known in the art and to the inventors.

A heat source is built into reactor 33, and, in embodiments of the present invention the heater is constrained in height to accommodate unique overall low-profile requirements for the CAR unit.

In a preferred embodiment of the present invention, one vacuum pump can pump down all or any number of compact reactor units 33. This is accomplished with a vacuum interface installed between the vacuum pump and reactor units to which all vacuum lines leading from reactor units are connected. At each connection, a valve is presented that can open and close per programmed instruction so that any combination of reactor units can be pumped down simultaneously or separately. In a preferred embodiment, one or more reactor units could be brought to ambient Nitrogen or air, and isolated by closing valves 60 and 61, leaving other units under vacuum and so on.

In a preferred embodiment of the present invention individual compact reactor units can be easily removed from the interfacing wall of vacuum chamber 32 of FIG. 5 by disconnecting quick connects, unplugging electrical wires, uncoupling flange 54 from the interfacing chamber wall, and removing reactor unit 33 from the stacking fixture or rack used for positioning and support. A flange plug (solid flange with o-ring) in some instances is provided to be bolted or clamped to a chamber wall or mating flange so that a number of reactor units might be removed for maintenance and so on without requiring a complete shut down of the system or replacement with other LP-CAR units.

It will be apparent to one with skill in the art that there are a number of quick connects that could be used to facilitate easy removal of a reactor unit without departing from the spirit and scope of the present invention. These methods and such hardware are known in the art and to the inventors.

Figure 9:
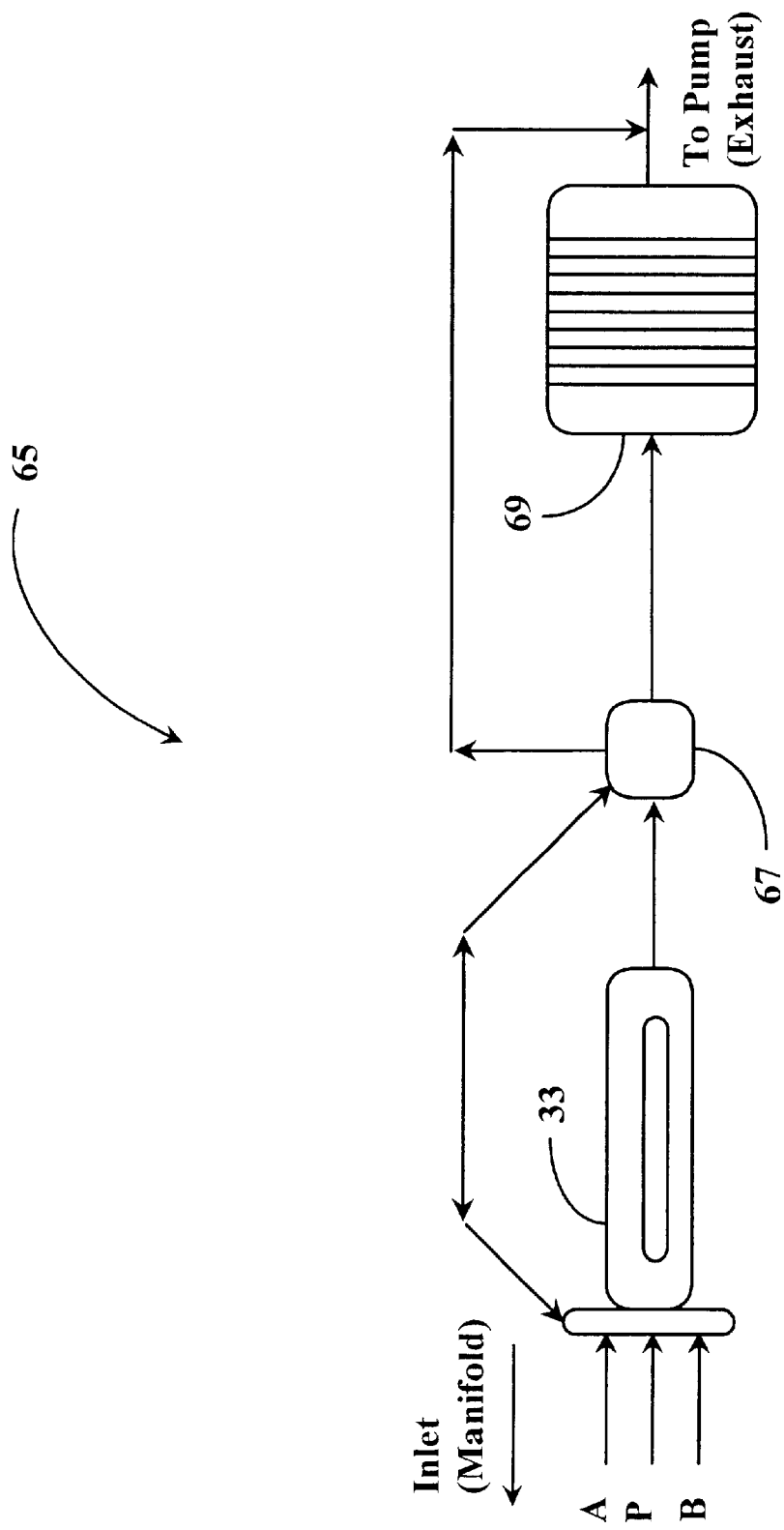
FIG. 9 is a diagram of a gas recycling and precursor trapping system according to an embodiment of the present invention.

FIG. 9 is a diagram of a gas recycling and precursor trapping system according to an embodiment of the present invention, wherein gas can be recycled and harmful byproducts can be trapped for disposal. Because precursors and gas purges are separately pulsed into compact reactor units 33 as described above, it follows that precursors or byproducts may be collected and trapped separately. Recycling and trapping system 65 is installed on the exhaust side of each reactor with a closed loop control connecting a three way fast-switching pneumatic valve with gas inlet manifold 55 of FIG. 4 so that purge gas P may be recycled back into reactor unit 33. Chemical species, represented by A and B, can be trapped separately in a precursor trap 69 (i.e. A cryo-trap) that can be removed for the purpose of disposing of harmful elements. Non-hazardous gases or chemicals may bypass precursor trap 69 and be pumped out by the exhaust pump. The innovative approach described and taught herein enables the usage of gas to be reduced and provides a more environmentally friendly process.

It will be apparent to the skilled artisan that in the case of serial processing, each reactor would have a trap system such as trap system 65 as described above. However, with parallel processing, where the same process is being performed in each reactor, then one trap system may be utilized on the exhaust side.

It will be apparent to one with skill in the art that a production system such as production system 19 of FIG. 5 may be utilized and integrated with a variety of technologies without departing from the spirit and scope of the present invention. For example, VESCAR unit 27 may share the robotic handler's platform interface with a CVD system, a cleaning module, a lithography unit, or other process unit known in the art. It will also be apparent to one with skill in the art that because of the uniformity characteristics inherent with the ALD process through chemisorption, there are no substrate size limitations or reactor number limitations. Therefore VESCAR unit 27 may be designed for optimum commercial application with respect to other competing technologies. There are many other configuration and application embodiments that are possible, many of which have already been described.

A Universal Chamber for use with a Cluster Tool System

Figure 10A:
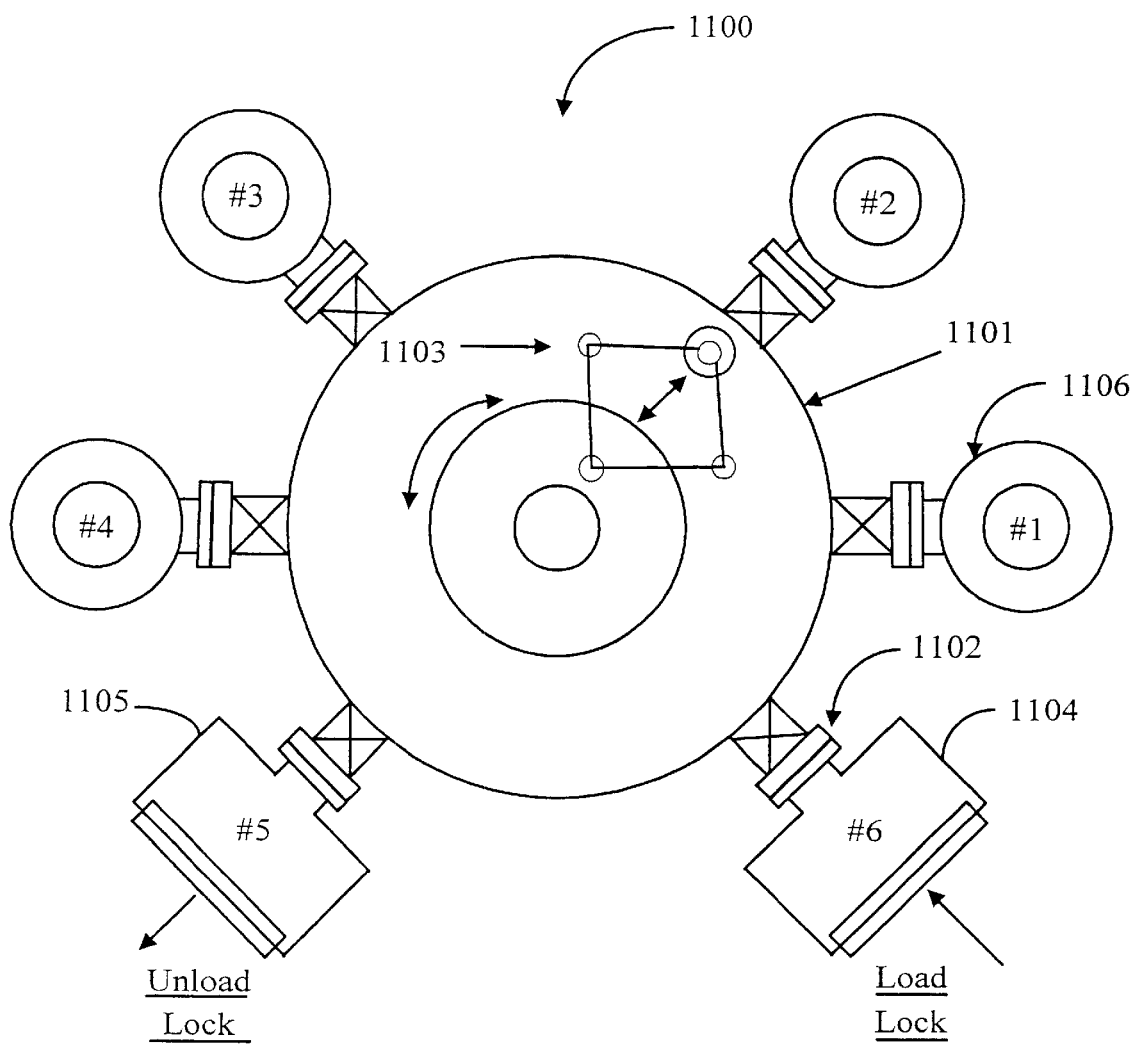
FIG. 10A is an idealized plan view of a cluster-tool-based processing system as known in the art, and as used in embodiments of the present invention.

FIG. 10A is a mostly diagrammatical plan view of a cluster-tool-based processing system as used both in the prior art and in practicing the present invention. The cluster tool itself is a material handling system operating substantially within a vacuum chamber 1101. A wafer transfer apparatus 1103 is positioned to operate from the center of the vacuum chamber, and is adapted to place and retrieve, by rotation and extension, substrates, typically semiconductor wafers in IC manufacturing sequences, from and to processing station appended at points around the periphery of substantially circular vacuum transfer chamber 1101.

In the system shown there are 6 station positions numbered 1 through 6, and each of these stations is adapted to chamber 1101 by a mounting flange and slit valve arrangement 1102. In this scheme two stations, 5 and 6, are used as airlocks for bringing wafers into and out of chamber 1101, which is held under high vacuum by pumping apparatus not shown, and the remaining four stations 1–4 are available for processing.

Wafers are moved from outside into chamber 1101 through load-lock 1104, then typically sequentially through the four processing stations, and back to outside through unload lock 1105. It is not necessary, however, that the wafers move sequentially through the four processing stations, as transfer apparatus 1103 is capable of placing and retrieving in any desired order.

Figure 10B:
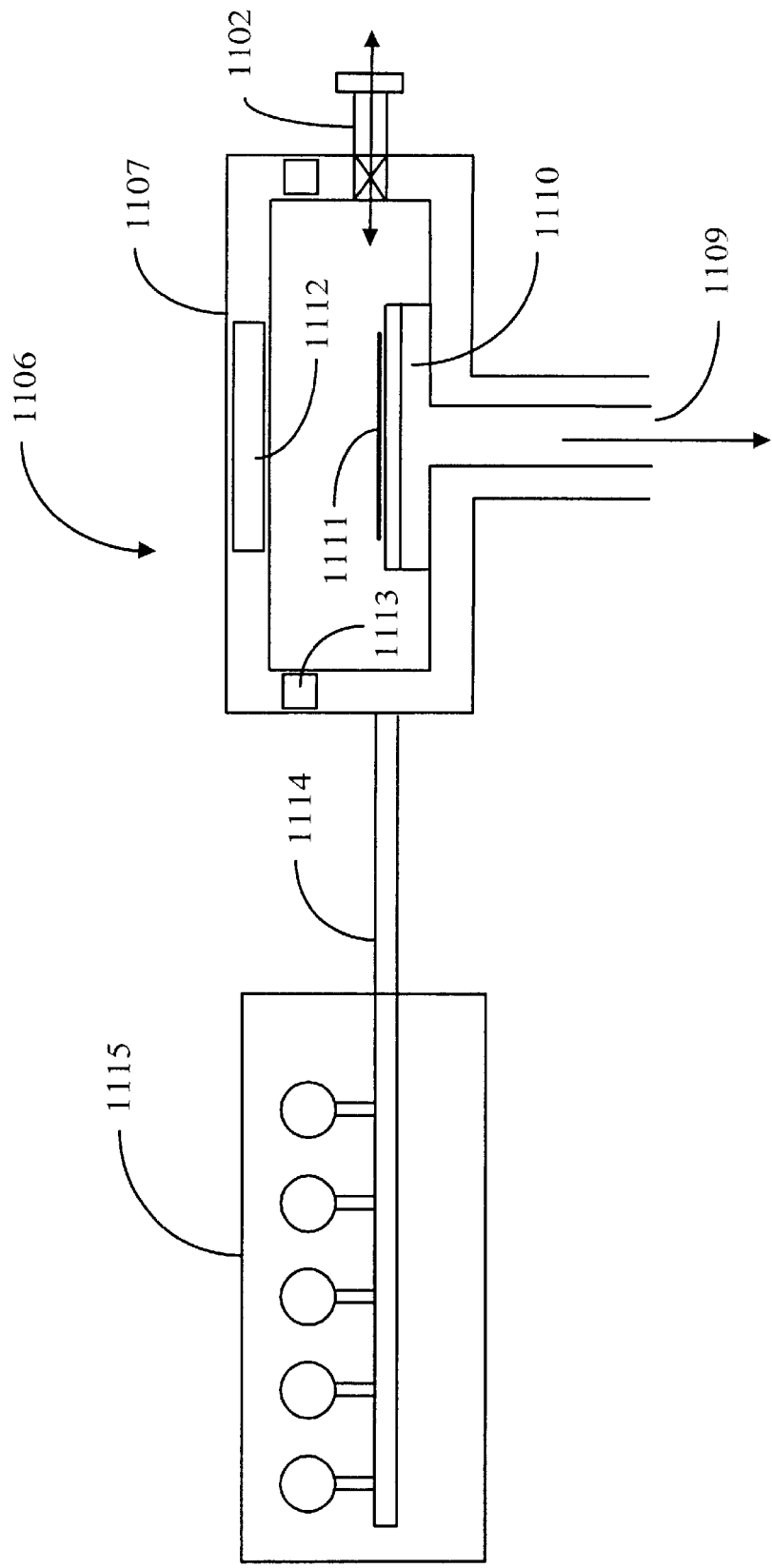
FIG. 10B is a cross-section elevation view, mostly diagrammatical, of a conventional CVD processing station as known in the art.

FIG. 10B is a cross-section elevation view of station 1106 of FIG. 10A, showing some additional typical features of such a processing station. Station 1106 is based on a sealable process chamber interfacing to chamber 1101 of FIG. 10A through flanged slit valve apparatus 1102. It is through this interface that wafers are brought into chamber 1107 for processing, and removed from chamber 1107 after processing. Chamber 1107 has a vacuum pumping port 1109, through which the chamber is evacuated, and a heatable hearth 1110 for supporting a wafer 1111 during processing. Gases used in processing are introduced from a gas feed and control unit 1115 through conduit(s) 1114 via ring manifold 1113 and showerhead manifold 1112.

In the system of FIG. 10A, chamber 1101 is pumped by substantial vacuum pumps at all times to keep all of the volume in the chamber under high vacuum. The purpose is to avoid contamination by atmospheric gases between processing stations. Wafers to be processed are placed in load-lock chamber 1104, typically in a carrier, and the load-lock is evacuated to a vacuum level on the order of the vacuum level in chamber 1101. An inner valve is then opened, and wafers may then be retrieved from the load-lock by transfer apparatus 1103 and transferred to any one of processing stations 1–4.

Typically during processing in one of the processing stations, vacuum pumping is throttled to control process chamber pressure without using excessive quantities of process gases. Such throttling may be accomplished in a number of ways, including valves having controllable openings. In a typical process cycle, after processing is complete, gases are valved off in unit 1115 (FIG. 10B), and the throttling mechanism is opened to allow maximum pumping speed in the processing chamber. The purpose is to reduce the gas pressure in the processing chamber to a value close to that in transfer chamber 1107. Then the slit valve in apparatus 1102 is opened, and transfer apparatus 1103 enters the processing chamber and retrieves the processed wafer (1111). The retrieved wafer is typically transferred via apparatus 103 to another processing station, then a wafer from the load-lock or from another processing station is inserted and placed on hearth 1111, after which the transfer apparatus withdraws.

Once a new wafer is on the hearth in the processing chamber, the slit valve associated with apparatus 1102 is closed again, isolating the process chamber from transfer chamber 1101. Then process gases are introduced from unit 1115 through conduit(s) 1114 and pumping speed is throttled.

There are, as was briefly described above, many processes that are accomplished in processing stations of the general nature described with reference to FIGS. 10A and 10B. Cleaning, etching, backsputtering, and many different deposition recipes may be accomplished, for example. Typically each process is served by a chamber specifically designed for that process.

Figure 11A:
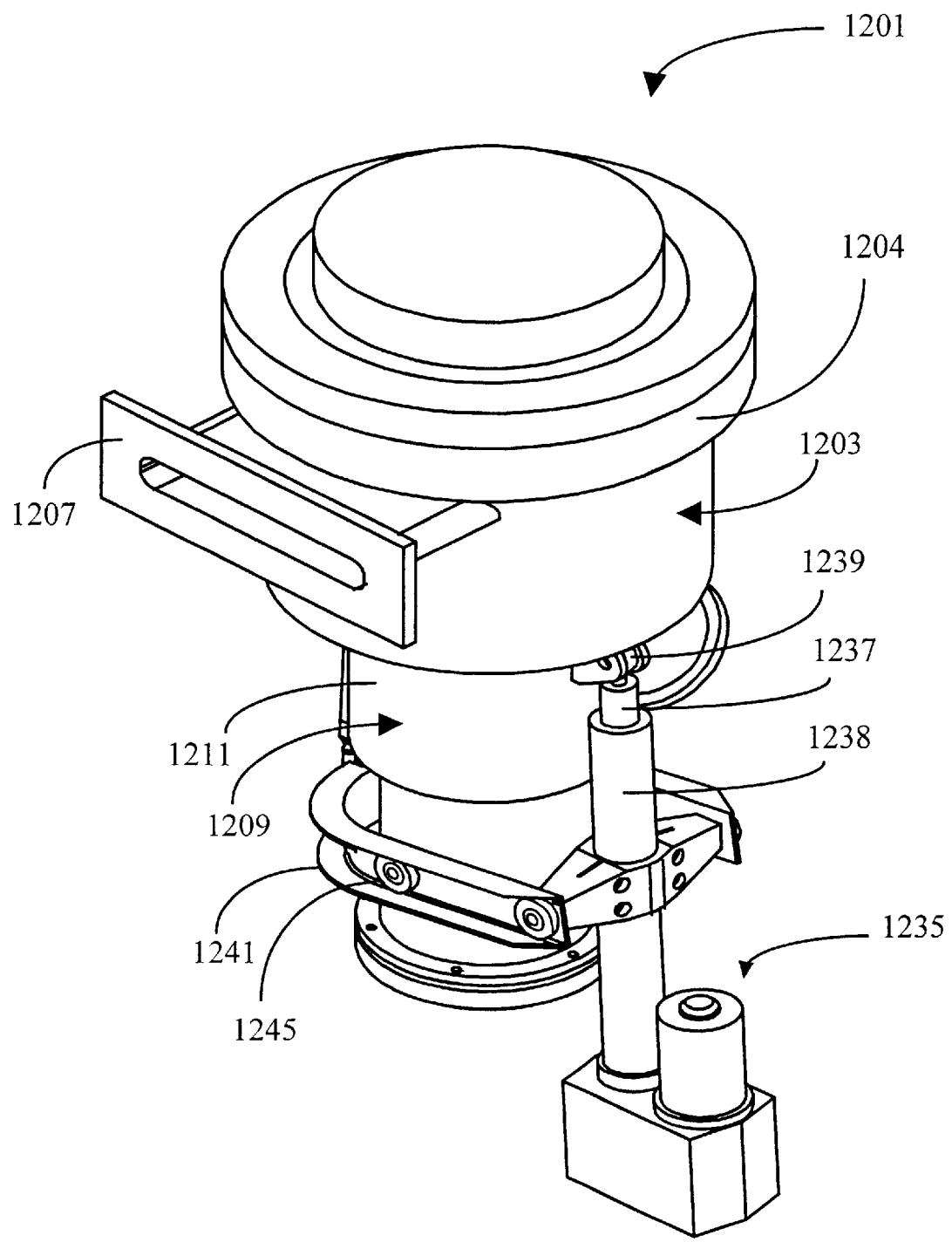
FIG. 11A is an isometric view of a multipurpose processing station according to a preferred embodiment of the present invention.
Figure 11B:
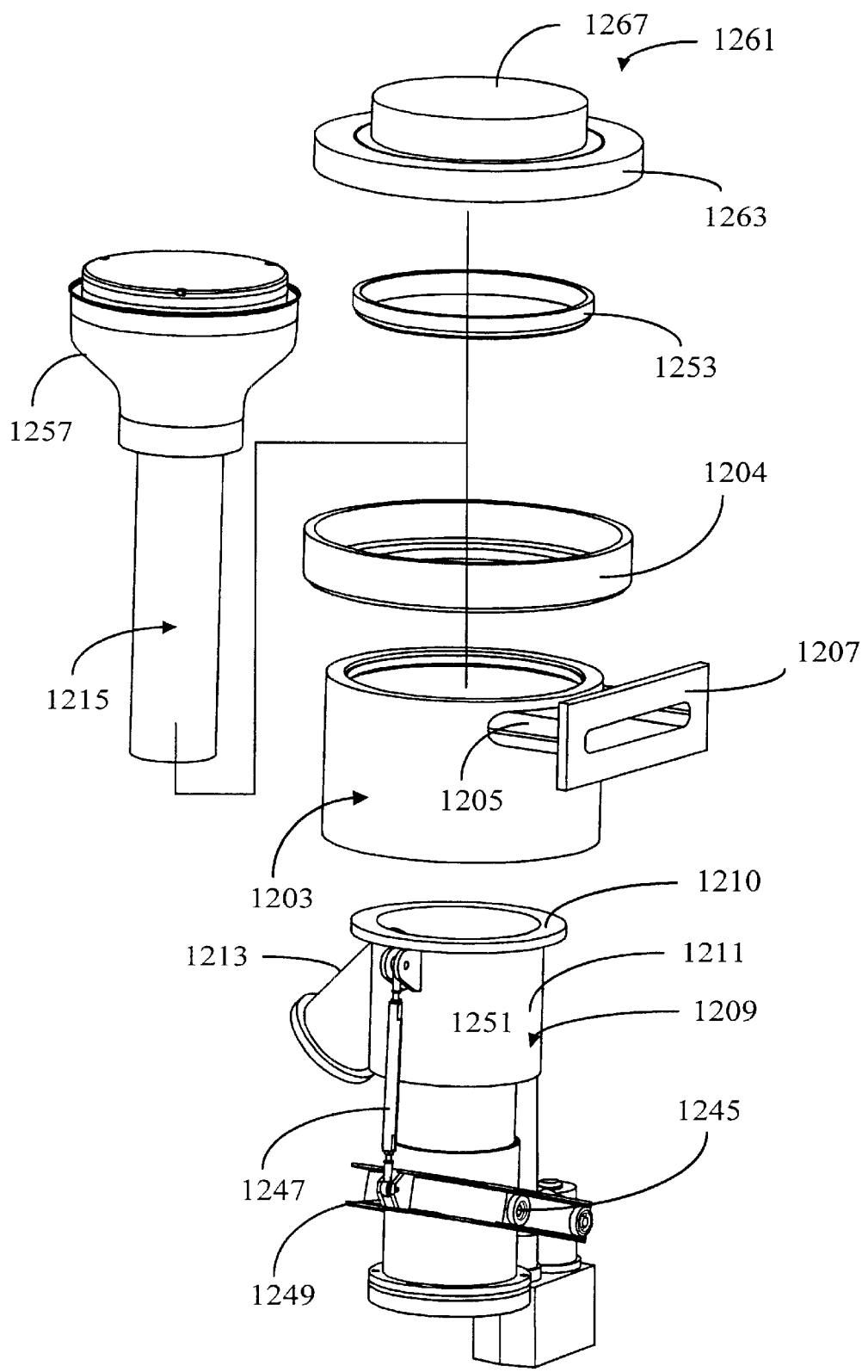
FIG. 11B is an exploded view of the multipurpose processing chamber of FIG. 11A.
Figure 11C:
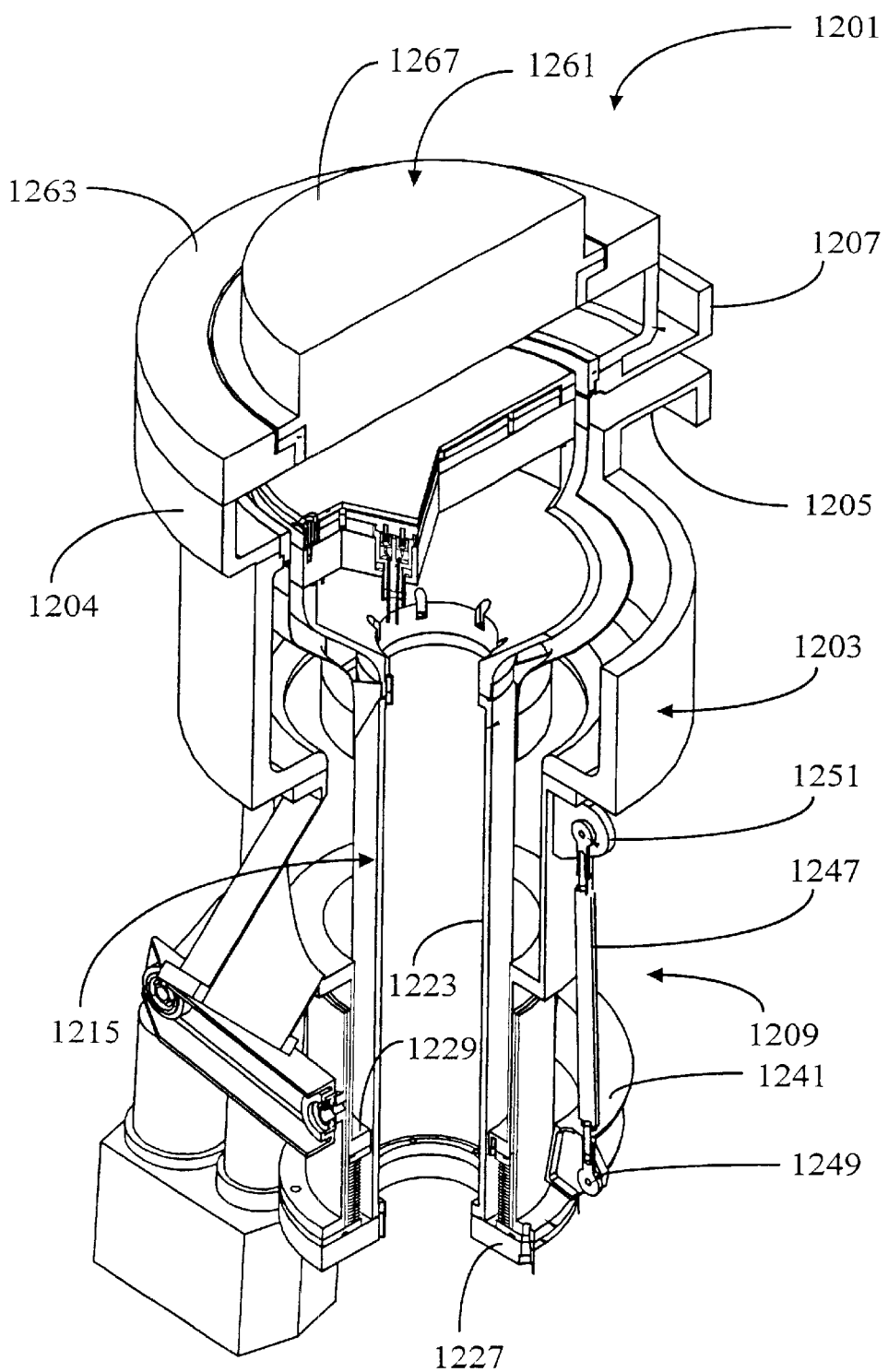
FIG. 11C is an isometric, cutaway elevation view of the multipurpose processing station apparatus of FIG. 11A.
Figure 11D:
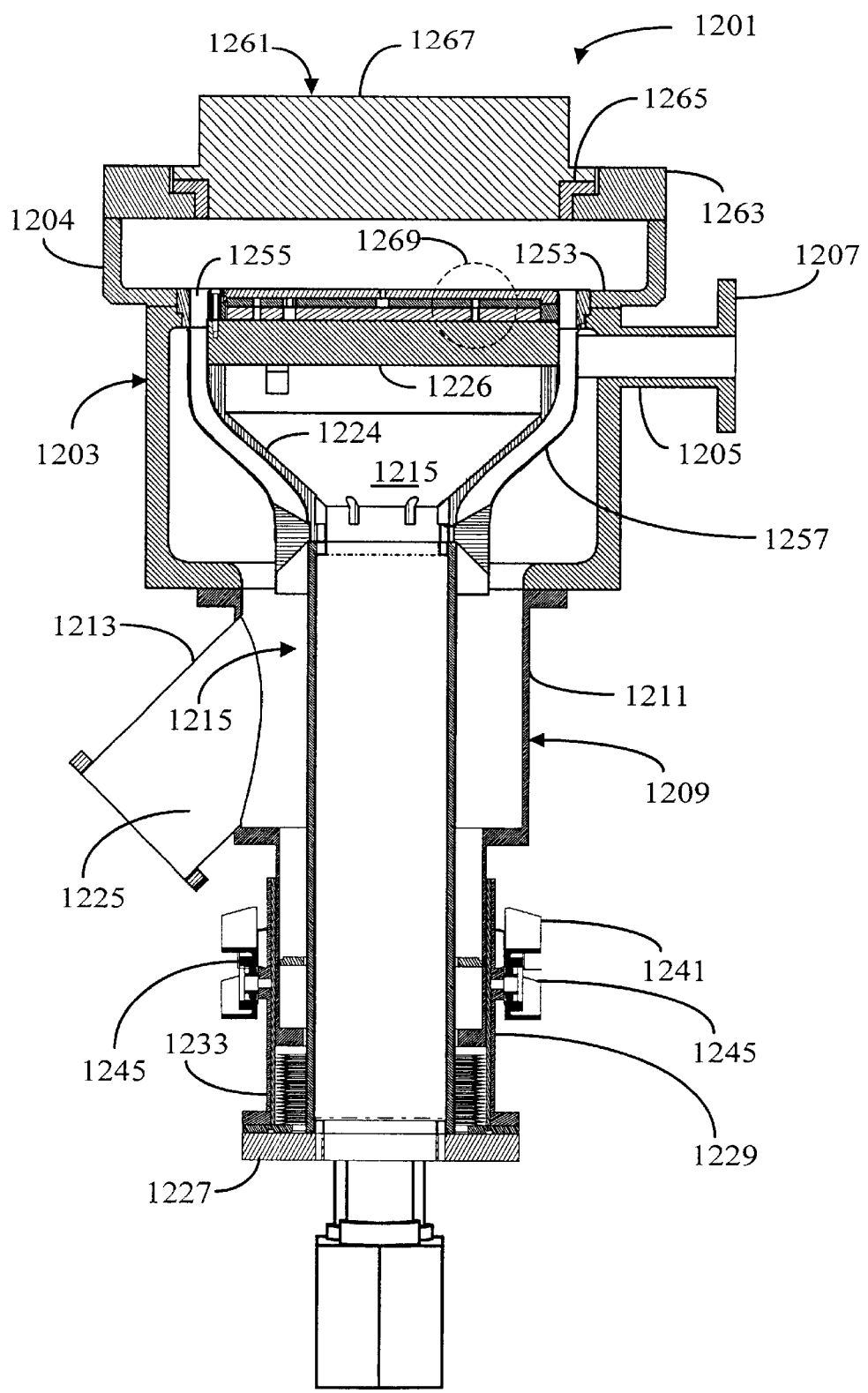
FIG. 11D is an elevation section view of the multipurpose processing chamber of FIG. 11A, shown in processing mode.
Figure 11E:
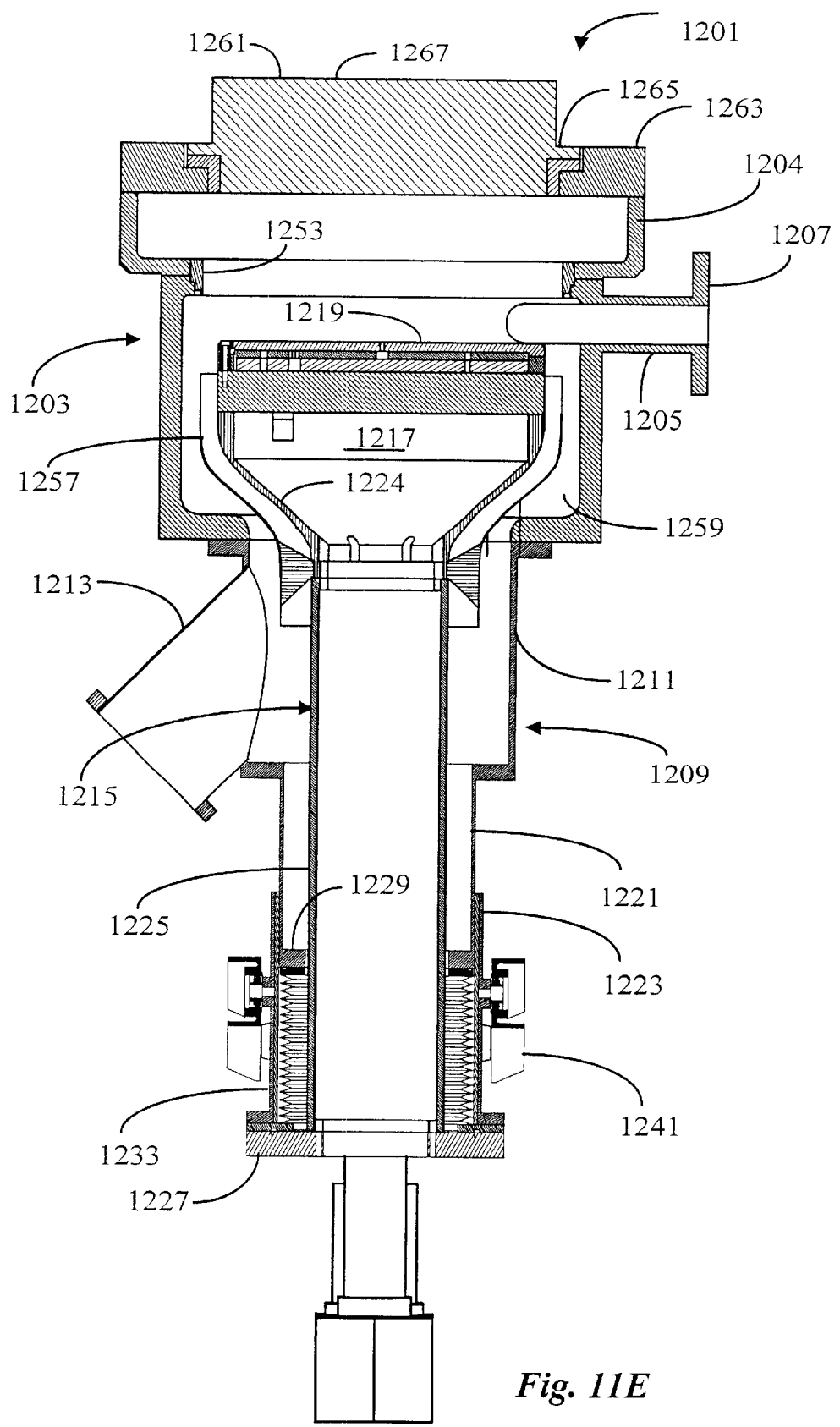
FIG. 11E is an elevation section view of the apparatus of FIG. 11A shown in transfer mode.

FIG. 11A is an isometric view of a multipurpose processing station 1201 according to a preferred embodiment of the present invention, capable of performing a broad variety of processes, and FIG. 11B is an exploded view of the multipurpose processing station of FIG. 11A. FIG. 11C is an isometric, cutaway elevation view of the multipurpose processing station shown in FIGS. 11A and 11B, seen from a different perspective than that of FIG. 11A. FIG. 11D is an elevation section view of the multipurpose processing station of FIG. 11A, shown in processing mode, and FIG. 11E is an elevation section view of the apparatus of FIG. 11A, shown in transfer mode. As the multipurpose station in its embodiments is a relatively complicated apparatus, several views and sections have been provided to better illustrate the features and elements of the station, and the descriptions which follow bearing on the multipurpose processing station are best understood by reference to all of the views provided.

Referring now primarily to FIGS. 11A and 11B, multi-purpose processing station 1201 is attached to a cluster tool by base chamber 1203, which, when assembled with other elements provides vacuum integrity. Base chamber 1203 has a side extending passage 1205 ending in a flange 1207 which is adapted to mount to a mating flange on a cluster tool transfer apparatus in the manner that station 1104 mounts to system 1100 (FIG. 10A). A slit valve is not shown, and in this embodiment is a part of the cluster tool apparatus to which flange 1207 mounts.

A cylindrical (in this embodiment) processing chamber 1204 mounts to an upper end of base chamber 1203 with vacuum seals providing vacuum integrity at the interface, and a lid assembly 1261 seals to the upper end of the process chamber with vacuum seals. The lid assembly in this embodiment is hinged to the process chamber and also has apparatus for providing process gases into the process chamber. The lid assembly and associated apparatus are described more fully below. For the present portion of the description it is important to note (FIGS. 11C and 11D) that the process chamber with the lid assembly and pedestal provides a closed processing volume.

A drive assembly 1209 mounts below to base chamber 1203 by a horizontal flange with vacuum seals. The horizontal flange is a part of an upper cylindrical housing 1211 which has a side outlet 1213 for attachment to a vacuum pumping system not shown. Upper housing 1211, by virtue of being rigidly mounted to base chamber 1203, which is in turn rigidly mounted to the vacuum transfer chamber of a cluster tool, is a stationary element providing structural support for other elements, as will be clear from further description below.

The purpose of the drive assembly is to raise and lower an internal pedestal apparatus 1215 (FIG. 11B). The pedestal apparatus has a heated hearth for supporting and providing heat to a wafer to be processed. When the pedestal is in a lowermost position wafers may be inserted into the base chamber and released to lie upon the hearth, and after the transfer apparatus withdraws through extension 1205 and the associated slit valve closes, the pedestal may be raised, moving the supported wafer up into a process chamber in position to be processed.

Relationship of pedestal apparatus 1215 to the drive assembly may best be seen in FIGS. 11C, 11D, and 11E. Pedestal apparatus 1215 has an upper portion 1217 comprising a heater plate, an electrical insulator plate, and other elements which are described in more detail in sections below. For the present description regarding the drive assembly, the connection of the pedestal apparatus to the drive assembly is of primary interest.

FIG. 11E shows pedestal apparatus 1215 in its lowermost position having a wafer 1219 supported on upper portion 1217 of the pedestal apparatus. In this position a transfer apparatus (1103 of FIG. 10A) may enter the base chamber through extension 1205 and pick and place wafers on the upper portion of the pedestal apparatus. For the present description it may be assumed wafer 1219 has been placed on the pedestal apparatus.

Attention is now directed to upper housing 1211 of drive assembly 1209. A rigid lower cylindrical housing 1221, of lesser diameter than upper housing 1211 extends below upper housing 1211. Pedestal apparatus 1215 has an upper structure 1224 and a lower extension 1225 ending in a flange 1227 to which an outer cylindrical member 1223 is also mounted, creating an annular region therebetween. Outer cylindrical member 1223 is lined with a bearing material and is adapted to fit closely around lower housing 1221, forming thereby a vertical linear guide for raising and lowering pedestal apparatus 1215 reliably with no eccentric loads.

Vacuum integrity is maintained for the overall assembly while allowing vertical freedom of motion for the pedestal apparatus by a metal bellows 1233 which seals between flange 1227 at a lower end and a flange 1229 affixed by its outer diameter to the lower end of lower cylindrical housing 1221. Flange 1229 is stationary, as it is a part of lower housing 1221 attached to housing 1211 which is mounted to base chamber 1203. Flange 1227, by virtue of being attached to lower extension 1225 of pedestal apparatus 1215, travels up and down with pedestal apparatus 1215. As the pedestal apparatus is lowered, bellows 1233 extends, and as pedestal apparatus 1215 is raised, bellows 1233 retracts. The pedestal apparatus is restrained in its vertical path by the inside diameter of flange 1229 and primarily by the internal bearing within cylinder 1223.

In regard to drive assembly 1209 and raising and lowering the pedestal apparatus, it remains to describe the mechanisms by which pedestal apparatus 215 is translated between the lowermost position (FIG. 11E and the uppermost position (FIG. 11D). Referring now primarily to FIG. 11A, drive assembly 1209 includes an electrically actuated and powered linear actuator 1235 in this embodiment having an extensible shaft 1237 within a guide housing 1238, wherein the extensible shaft may be extended and retracted within housing 1238 as initiated by control signals received from a control system not shown. One end of extensible shaft 1237 is pivotally attached by a clevis 1239 to upper housing 1211 of the drive assembly. A yoke assembly 1241 comprising a U-shaped track encircles the body of cylinder 1223 (which is fixedly attached to pedestal assembly 1215) and is pivotally attached at the ends of the U-shaped track to opposite ends of a clamp bar 1243, and the clamp bar clamps on drive housing 1238.

Referring now to FIGS. 11B and 11C, yoke assembly 1241 engages two bearings 1245 which are mounted to opposite sides of cylinder 1223. Referring now to FIG. 11B, at the center of the curved end of the U-shaped track of cam-track/yoke assembly 1241, one end of an adjustable-length link 1247 is pivotally fastened by a clevis 1249. The opposite end of link 1247 is fastened again to housing 1211 by a clevis 1251.

In the arrangement described above, as extensible shaft 1237 is extended, the yoke assembly is moved as a lever having the attachment at clevis 1249 as a fulcrum, such that cylinder 1223 is lowered a distance about one-half the length that shaft 1237 is extended, causing the entire pedestal assembly to be lowered relative to the process chamber and the base chamber. As shaft 1237 is retracted the pedestal assembly is similarly raised relative to the base and process chambers.

It will be apparent to those with skill in the art that there are other mechanisms by which the pedestal assembly may be translated relative to the base and process chambers, and there are a variety of alterations in the mechanisms shown that might be made without departing from the scope of the invention. There are, for example, a number of different extensible drives that might be used, such a air cylinders, air-oil systems, hydraulic systems, and the like. The embodiment described provides smooth translation and accuracy.

In an aspect of the present invention vertical movement of the pedestal assembly, which provides for a lower position for inserting and retrieving wafers through extension 1205, and an upper position wherein a wafer on the pedestal is presented upward into the processing chamber for processing, also provides for a different pumping speed between the upper position and the lower. Also the elements that make this possible also allow for easy alteration of the actual pumping speed in the process position. These features are best understood with reference to FIGS. 11D and 11E.

Referring to FIGS. 11D and 11E a ring-shaped liner 1253 is positioned at the point that base chamber 1203 joins process chamber 1204. The inside diameter of liner 1253 determines area of an annular passage 1255 (FIG. 11D) formed between liner 1253 and the top edge of pedestal 1215 when the pedestal is in the uppermost position. Liner 1253 is also made of a material that has a relatively low coefficient of conductive heat transfer, and thereby provides protection for the parts of the process chamber and the base chamber that are closest to the heated pedestal while the pedestal is in the processing (uppermost) position.

In conjunction with liner 1253, pedestal 1215 is provided with an annular shroud 1257 which is attached to the pedestal and forms a shaped pumping annulus. When pedestal 1215 is in the uppermost position the upper annulus that shroud 1257 forms with the body of pedestal 1215 mates with annulus 1255 by the upper rim of the shroud mating with liner 1253. Referring to FIG. 11D it is clear that the passage for pumping from the process chamber through side outlet pumping port 1213 is through the annular passage formed between shroud 1257 and the body of pedestal 1215.

Referring now to FIG. 11E, wherein pedestal 1215 has been moved to the lowermost position for transfer of wafers in and out of the station, it is clear that gases from the process area may still pass through the shroud annulus described above, but may also pass around the outside of the shroud through region 1259 and thence to region of housing 1211 and out through pumping port 1213.

It is well-known to those with skill in the art that pumping speed needs to be relatively high after processing and during wafer transfer, and has to be throttled to a lower, controlled speed during processing to assure total gas pressure during processing. In conventional systems this is accomplished by throttling valves and the like, typically in the pumping port of a chamber. In this aspect of the present invention this difference accrues simply by virtue of vertical translation of the pedestal assembly with the attached pumping shroud. In this aspect a throttling valve may still be used for precise process pressure control.

t will be apparent to those with skill in the art that one design for the liner and shroud will not provide for a broad variety of processes, both CVD and PECVD, which may require quite different pumping speeds in process. In the embodiment described of the present invention, for a different process, it is only necessary to remove the pedestal and replace the shroud and liner, which may be done at a planned downtime for routine maintenance and cleaning. Moreover, this replacement is a relatively simple matter due to unique design of other aspects Of the chamber, as will be described more fully below.

Referring now to FIGS. 11A through 11D, the process region is closed by a lid assembly 1261 comprising a lid ring 1263, an insulator ring 1265 and a gas diffuser assembly 1267. Gas diffuser assembly 1267 has ports not shown for introducing process gases, internal passages for conducting the process gases to the process chamber, and diffuser elements within the process region for distributing process gases evenly over a wafer on pedestal 1215 in position in the process chamber to be processed. Such ports, passages and distribution elements are well-known in the art.

Diffuser 1267 is nested in an insulator ring 1265 which provides electrical and thermal insulation for the diffuser assembly, and allows the diffuser assembly to be electrically biased relative to other elements as required in various process recipes. Such bias may be used to, for example, provide for exciting the process gases in the chamber to form a plasma, as known in plasma-enhanced CVD processes. Insulator ring 1265 joins to lid ring 1263 and to diffuser 1267 in a manner with vacuum seals to provide vacuum integrity and to provide also a rigid lid assembly. In a preferred embodiment lid assembly 1261 is hinged to process chamber 1204 with a removable vacuum seal, making access for cleaning and maintenance relatively facile and routine. In other embodiments the lid may be mounted differently and completely removed for access.

Referring now primarily to FIGS. 11D and 11E access to the inside of the process chamber may be made by releasing lid assembly 1261 and moving it out of the way. At the bottom of station 1201 easy access is provided to flange 1227 where the lower portion 1225 is fastened to flange 1227. With the lid assembly open one may dismount pedestal assembly 1215 from flange 1227 and remove it from the processing station out the open top. This feature provides quick and simple access to portions of the processing chamber requiring cleaning and maintenance, and also for trading liners and shrouds to provide new and different processing conditions.

Figure 12:
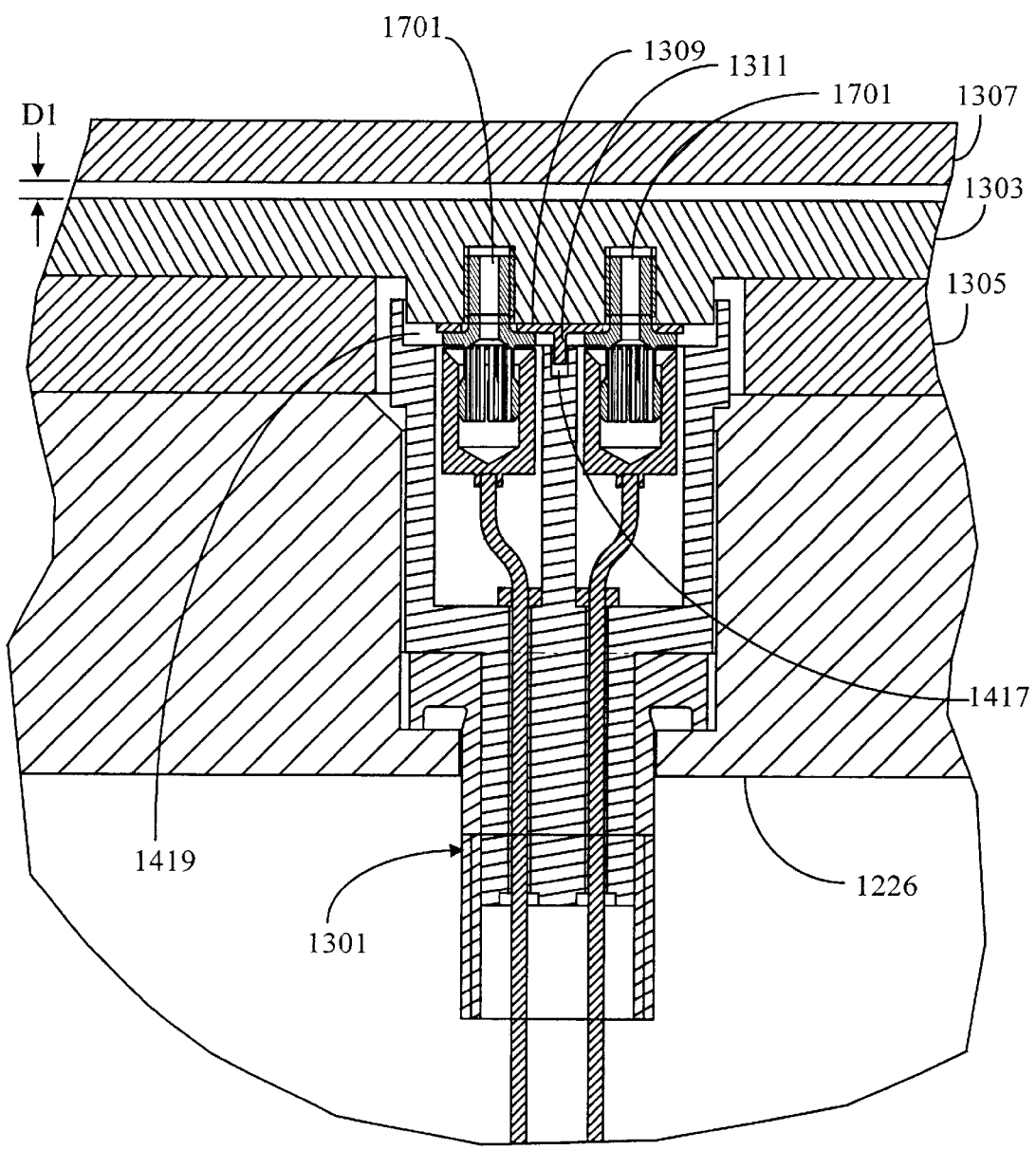
FIG. 12 is an elevation section view through a pedestal element, including an electrical feedthrough apparatus, from FIG. 11E.

Significant improvements over prior art have been provided in the architecture of the upper portions of pedestal 215. FIG. 12 is a partial cross section through the top region of pedestal 1215 at about the position of broken circle 1269 in FIG. 11D. As described above and as may be seen by reference in particular to FIG. 11C, pedestal 1215 is an assembly of an upper structure 1224 and a lower extension 1225. Upper structure 1224 is closed at the top by a closure plate 1226, and elements 1225, 1226, and 1224 are assembled with vacuum seals providing an essentially hollow vacuum-tight structure. Upper closure plate 1226 supports heater and electrode elements for supporting a wafer during processing as described more fully below with reference to FIG. 12. Closure plate 1226 of pedestal assembly 1215 is the base plate in FIG. 12, and is water-cooled to maintain operating temperature for vacuum seals, such as conventional O-rings and the like, and for other elements that might be damaged by high temperatures.

Referring now primarily to FIG. 12, closure plate 1226 is penetrated in this embodiment in two places by a unique electrical feedthrough unit 1301. One such penetration is shown in FIG. 12, but in a preferred embodiment there are two such penetrations serving a unique heater plate to be described in detail below. Feedthrough unit 1301 is adapted to closure plate 1226 with vacuum seals to preserve vacuum integrity. Feedthrough unit 1301 in one penetration of closure plate 1226 provides electrical power to heating elements in a heater plate 1303, which is spaced apart from closure plate 1226 by in electrical insulator plate 1305. The function of heater plate 1303 is to provide heat to a susceptor 1307 upon which a wafer rests during processing.

Susceptor 1307 is a mostly graphite structure which has a high coefficient of conductive heat transfer, and is spaced apart from heater plate 1303 by a small distance D1. Heater plate 1303 provides heat to susceptor 1307 by convection and radiation across gap D1, helping to provide a relatively constant temperature across its upper surface, hence over the surface of a wafer, and also providing an efficient electrode for high frequency electrical biasing. The susceptor forms an electrical entity which, for those processes requiring it, is biased through an RF feedthrough, not shown in FIG. 12.

Heater power wires connecting to two feedthroughs 1301, to a second feedthrough for RF power, and miscellaneous other conduits and connectors are provided to the region of the lower surface of closure plate 1226 by being guided up through the hollow interior of pedestal assembly 1215 (See FIGS. 11C, D, and E). Such wires and conduits for supplying power and other utilities to pedestal 1215 subassemblies and elements are not shown in these views to promote simplicity, and extend generally from external power and utility supplies as known in the art.

There are several other vacuum-sealed penetrations through closure plate 1226 in the preferred embodiment described herein, but not specifically shown in the drawing figures. These include thermocouples with appropriate feedthroughs for sensing temperature of internal elements and at least one optical sensor for monitoring temperature of the susceptor. Such feedthroughs are generally known in the art. An air-cylinder-operated mechanism for translating a pattern of typically three ceramic pins is adapted to the heater/susceptor assembly as well, and is used to raise and lower a wafer from the surface of susceptor 1307 to allow a transfer device to extend under a wafer for picking and placing wafers to and from the susceptor plate. In a preferred embodiment a pneumatic cylinder is adapted to the underside of closure plate 1226 such that the moving haft of the cylinder may be extended through an opening in the closure plate via a bellows seal. The pneumatic cylinder has a one-half inch stroke and operates a spider positioned below the heater that carries three ceramic pins that extend through small openings in the heater and the susceptor plate.

When pedestal 1215 is retracted as shown in FIG. 11E so a wafer may be transferred, a wafer on susceptor 1307 may be lifted off the upper surface of the susceptor by the ceramic pins referred t above, actuated by the pneumatic cylinder described. A transfer arm (see FIG. 10A, item 1103) may then extend into the process station beneath the a wafer on the pins but above the susceptor. Retracting the pins then places the wafer on the transfer arm, which may then be withdrawn along with the wafer. The process may be reversed for placing a new wafer to be processed on the susceptor.

Figure 13A:
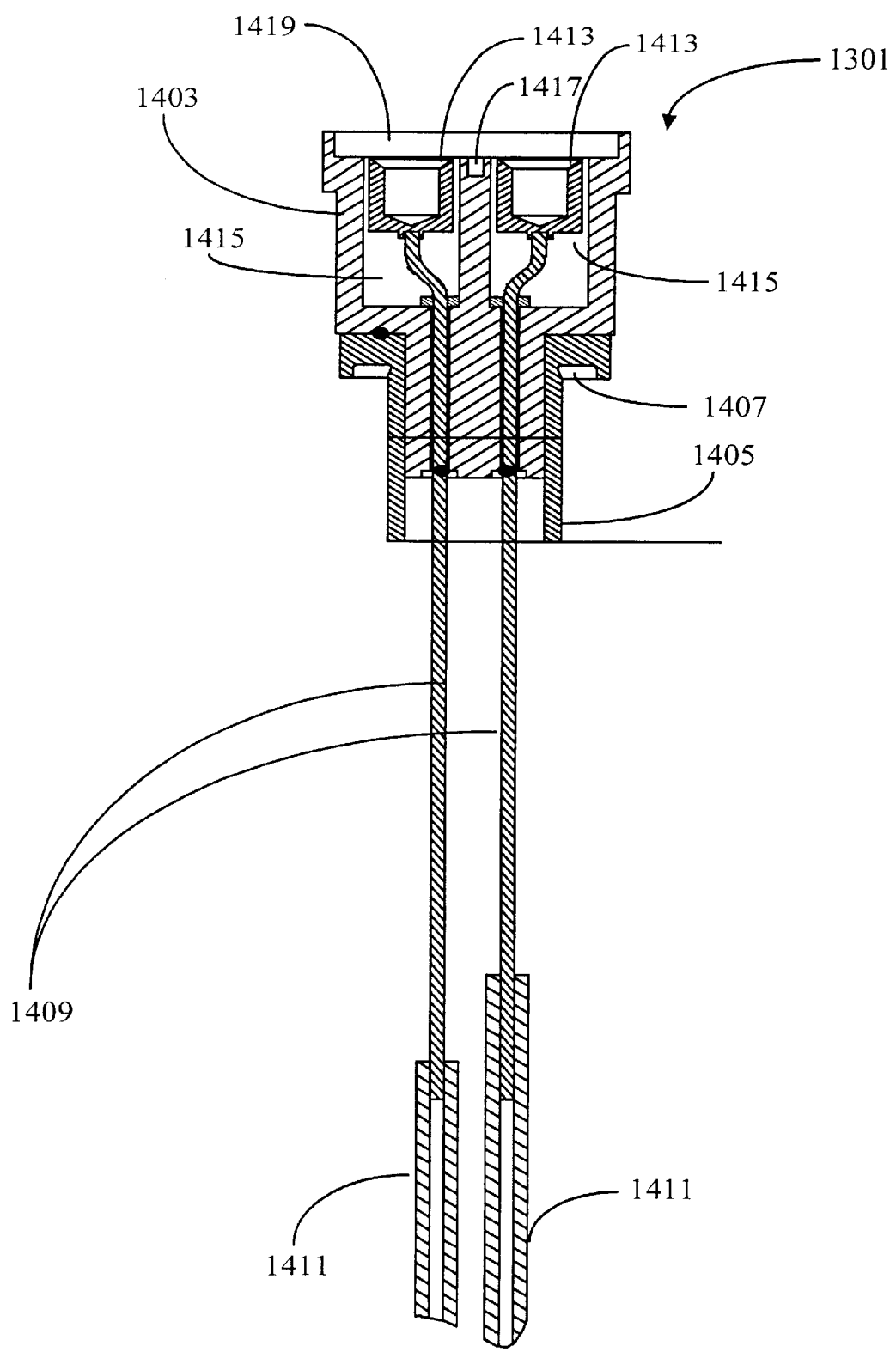
FIG. 13A is an elevation cross-section of the electrical feedthrough apparatus of FIG. 12.

Feedthrough 1301 of FIG. 12 is shown isolated in FIG. 13A. A ceramic body portion 1403 is joined by intermetallic bonding in this embodiment to a metal body portion 1405 which has a seal grove 1407 for a vacuum seal such as an o-ring, forming a unitary body sealable through an appropriate opening in closure plate 1226 (FIG. 12). Solid nickel wires 1409 are sealed through ceramic body portion 1403 also by intermetallic bonding as known in the art, and are joined to conventional power wires 1411 such as by soldering, at a distance great enough from the feedthrough that conducted heat will not be a problem.

On the vacuum side of feedthrough 1301 nickel wires 1409 are joined to sockets 1413 assembled in openings 1415 in ceramic body portion 1403 and adapted for receiving posts from heater plate 1303 (FIG. 12). The posts are described more fully below. Sockets 1413 are constrained in the vertical direction by wires 1409, which have considerable stiffness. Openings 1415 are somewhat larger in diameter than the diameters of sockets 1413, allowing sockets 1413 lateral freedom of movement (wires 1409 offer little resistance to lateral movement). This freedom of lateral movement allows for some movement and misalignment when assembling a heater plate having posts (as further described below) to a closure plate.

Figure 13C:
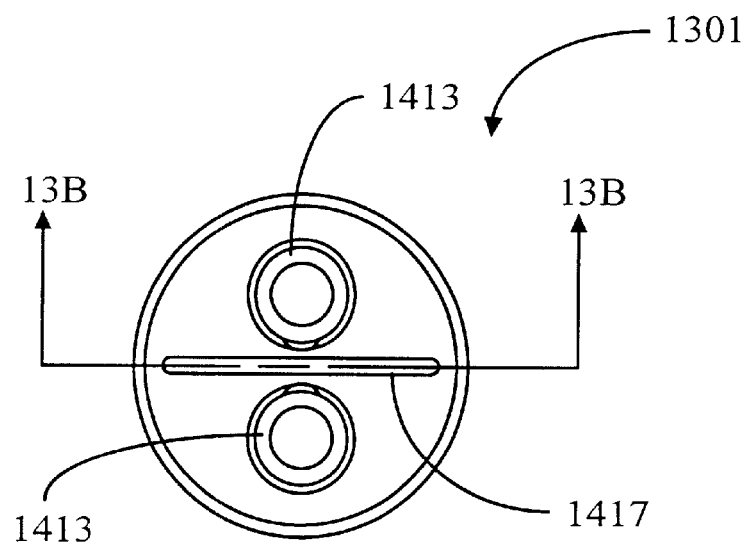
FIG. 13C is a top view of the feedthrough apparatus of FIG. 13A.
Figure 13B:
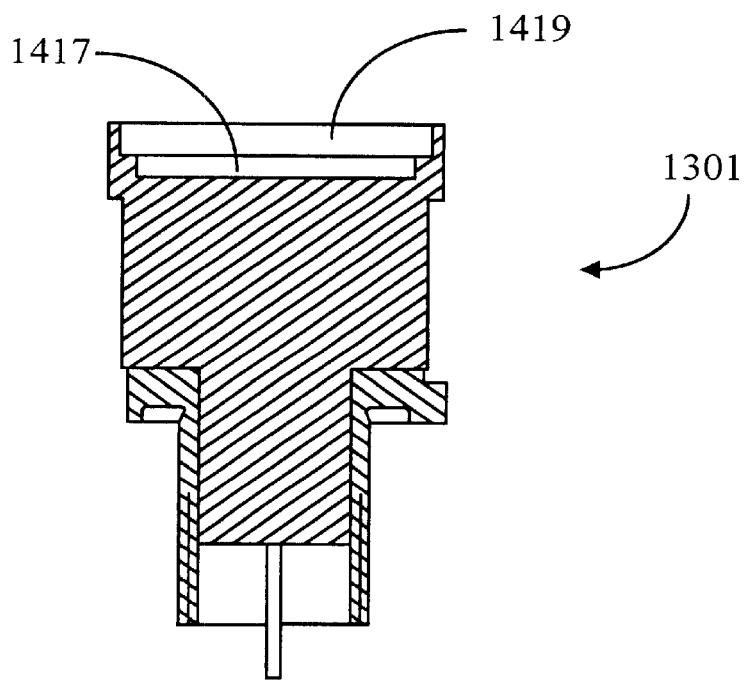
FIG. 13B is a section view taken through a body assembly of the feedthrough of FIG. 13A, taken along section line 13B—13B of FIG. 13C.

FIG. 13C is a top view of feedthrough 1301 of FIG. 13A, and FIG. 13B is a section view taken through the body assembly of feedthrough 1301 along section line 13B—13B of FIG. 13C, which is substantially rotated ninety degrees from the section of FIG. 13A. Section view 13B is along a groove 1417 in ceramic body portion 1403 below a circular declavity 1419. Declavity 1419 receives a circular portion of heater plate 1303 from which connector posts extend, and groove 1417 receives a baffle extension 1311 of a ceramic insulator barrier 1309 which serves to prevent line-of-sight electrical interaction between individual posts of the electrical feedthrough.

Figure 14A:
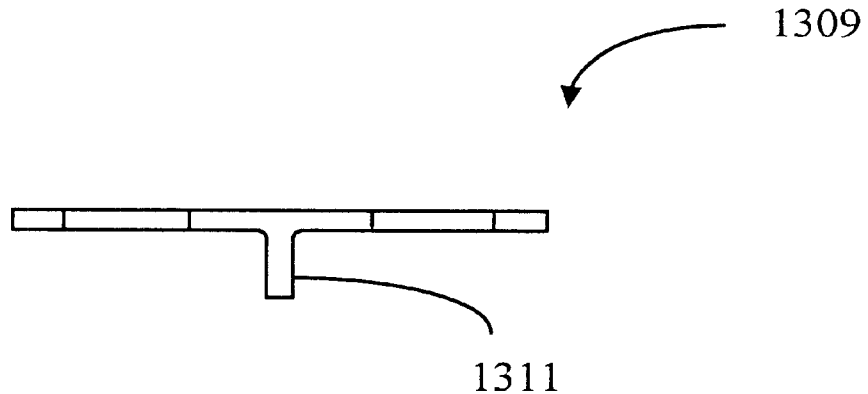
FIG. 14A is a side elevation view of a ceramic insulator barrier from FIG. 12.
Figure 14B:
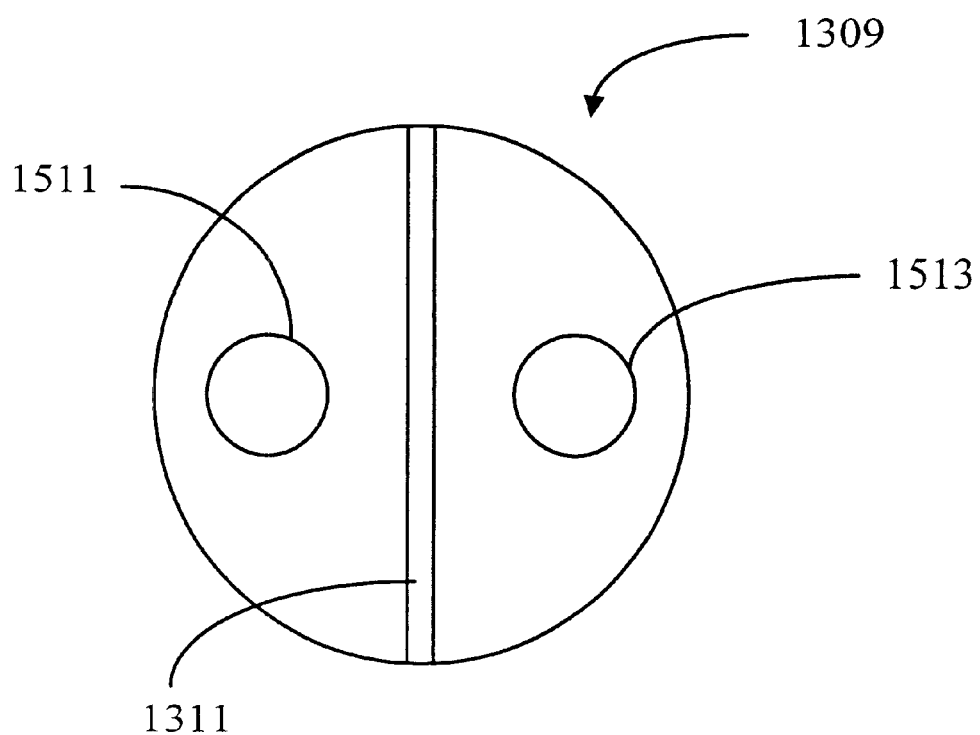
FIG. 14B is a plan view of the insulation barrier shown in side view in FIG. 14A.

FIGS. 14A and B show a top view and a side view of ceramic insulator barrier 1309, which has an overall diameter great enough to encompass the position of both sockets 1413. Barrier 1309 has circular openings 1511 and 1513 in this embodiment which are adapted to allow posts assembled to heater plate 1303 to pass through in a manner that is described in more detail below. Baffle extension 1311 of barrier 1309 extends as a barrier wall across the diameter of barrier 1309 at substantially ninety degrees to the flat body of the ceramic barrier, and is adapted to engage groove 1417 when a heater plate is assembled to a pedestal in the embodiment described.

FIG. 15A is an isometric view of heater plate 1303 of FIG. 12. FIG. 15B is a plan view of the same heater plate, and FIG. 15C is a side view. Heater plate 1303 in this embodiment is a unique two-zone heater having an inner region 1603 and an outer region 1605 separated by a dual channels 1607 and 1609 which pass through the thickness of the heater plate. Inner region 1603 is adapted to be about the diameter of a wafer to be placed on a susceptor over the heater, and outer region 1605 encompasses substantially the remainder of the area of the heater plate. Heater plate 1303 in this embodiment is a ceramic assembly with thin-film heating elements.

Two separate connector-post structures 1611 are constructed on heater plate 1303 in this embodiment, one to serve inner region 1603 and the other to serve outer region 1605. The provision of two separate regions capable of being powered independently allows tuning heat distribution to combat edge effects in heating a wafer on a susceptor overlying the two-zone heater, which allows a wafer to be heated evenly all the way to the outer diameter, a significant advance over prior art heaters.

FIGS. 16A, B, and C illustrate a unique connector post 1701 used in the present embodiment in conjunction with the heater plate and socket assembly described above with reference primarily to FIGS. 13A, B, and C. FIG. 16A is an isometric view of connector post 1701, FIG. 16B is an enlarged end view, and FIG. 16C is a section view taken along section line 16C—16C of FIG. 16B.

Connector post 1701 has a threaded portion 1703, a flange 1705 and a flexible-finger post extension 1707. The overall length in the present embodiment is about one-half inch, with about one-quarter inch devoted to each of the threaded portion and the post extension, but larger and smaller posts may be used in other embodiments. The thread for the threaded portion is preferably a fine thread, but several different thread sizes may be used.

In the preferred embodiment shown in FIGS. 16A, B and C post extension 1707 of connector post 1701 is divided into 12 equal flexible fingers such as fingers 1709 illustrated. The connector post is typically made from a chemically-resistant material such as one of several types of stainless steel, and is heat treated in a manner known in the art to provide for appropriate spring tension of the fingers.

Referring now to FIGS. 15A, B and C, each connector-post structure 1611 has a raised land 1601 with two threaded holes. An insulator barrier 1309 is placed on each raised land, and connector posts 1701 are threaded through openings 1511 and 1513 in the insulator barrier such that flanges 1705 capture and hold the insulator barriers against the heater plate. This assembly is clearly illustrated with reference to FIG. 12. Heater plate 1303 is designed so that the threaded holes allow each heater post to mate with an appropriate heating element in the heater plate. It will be apparent to those with skill in the art that there are many alternative arrangements that might be made in heater design to utilize the unique structure described.

Referring again to FIG. 12, feedthrough penetrations with feedthroughs 1301 are provided in closure plate 1226 in the pattern required to mate with connector-post structures 1611 of a heater plate 1303. When a heater plate is assembled to a closure plate, the raised land 1601 of each connector-post structure engages circular declavity 1419 (see also FIGS. 13A and 13B). At the same time baffle extension 1311 of insulator baffle 1309 engages groove 1417, creating a no-line-of-sight connection. As described above, sockets 1413 on wires 1409 of feedthrough 1301 allow some lateral movement, which, together with the flexible fingers of the posts ensures facile and positive engagement.

In the preferred embodiment described herein there are two connector-post structures providing power connection to two separate heater regions in a single heater plate. In this embodiment a separate single-post structure not illustrated but using the same socket and post arrangement (but single post) provided for high frequency connection for RF biasing in plasma-enhanced CVD (PECVD) processes. It will be apparent to those with skill in the art, however, that there may be more or fewer connector-post structures, and a dual post feedthrough may well be used for high-frequency biasing as well.

It will be apparent to those with skill in the art that there are many alterations in detail and scale that may be made in the embodiments described herein without departing from the spirit and scope of the present invention. Many such variations have already been mentioned. There are many others. For example, there are many wafer sizes presently in use in integrated circuit manufacturing, and processing stations according top embodiments of the present invention may be constructed to accommodate individual wafer sizes or a range of wafer sizes. A station according to the invention might, for example, be sized to accommodate wafers of up to 12 inches or more in diameter, but be fitted with heater structure to properly, evenly, and efficiently heat a wafer of nominal eight-inch diameter.

As another example of the breadth of the present invention, drive assembly 1209 described in detail above provides an efficient, smooth and extremely long-life drive for raising and lowering a pedestal assembly in various embodiments of the present invention. There are many variations in this drive that might be used, though, and even completely different drives that might be incorporated in some embodiments while retaining a unique inventive difference over the existing art.

Use of the Multipurpose Processing Chamber for ALD Processes

In another aspect of the present invention the multipurpose process chamber described above with reference to FIGS. 10A through 16C is used for performing atomic layer deposition (ALD) processes as disclosed and described above with reference to FIGS. 1A through 9.

Referring now to FIG. 5, a system arrangement is shown wherein a VESCAR arrangement 27 is interfaced to a vacuum-central substrate handler 23. As was described with reference to FIG. 7, plural VESCAR units could be interfaced to slit valves of the vacuum-central substrate handler. Handler 23 is essentially the same cluster-tool handler as described with the aid of FIG. 10A, and it will be apparent, giving the teachings herein, that either the multipurpose chamber or a VESCAR unit, or one or more of each, may be interfaced to such a cluster-tool handler.

In a preferred embodiment of the invention at least one multipurpose chamber according to the descriptions above is interfaced to a cluster-tool handler, and gas provision and control apparatus is provided for the multipurpose chamber according to the descriptions provided above with reference to FIGS. 8 and 9. Preferably plural multipurpose chambers (now ALD chambers) are so interfaced along with at least one load-lock apparatus so wafers to be coated may be loaded to and unloaded from the affixed ALD chambers. In this way as many wafers as there are ALD chambers may be introduced for each cycle, and each wafer will have its own dedicated process chamber for the ALD process to be performed. The processes may be identical, or they may be vastly different, and load, unload, and processing parameters may be programmed to suit.

Attention is now drawn to FIGS. 11D and 11E, which shown one of the multipurpose chambers in a processing position (11D) and in a transfer position (11E). Chamber 1204 in the present aspect is provided in a manner particularly adapted to the size of a wafer to be coated by ALD process, minimizing the volume of the chamber consistent with gas flow. The volume of the chamber is established when the pedestal is in its uppermost position, as opposed to the apparently larger volume when the pedestal is retracted (FIG. 11E).

ALD gas provision is through a special lid, shown generically as lid 1267, and special circumstances may be addresses, such as a change in wafer thickness, film material, and so forth, by substituting lids to the multipurpose chamber. Similarly, the pumping speed for processing is determined in the processing position by the annulus 1225 formed when the pedestal is in the uppermost position. Pumping requirements may be fine-tuned by interchanging rings 1253 (FIG. 11E).

In operation, pedestals are retracted, finished wafers are unloaded, and new wafers are loaded to each chamber in the cluster-tool arrangement. The slit valve interfaces are closed and pedestals are advanced. In the process the wafer hearth in each chamber is maintained at temperature, so the wafers rapidly come up to processing temperature, which may be aided by hot gas infusion. With the wafers a coating temperature the gas flows regimen is imposed for each chamber, and the ALD process accrues.

It will be apparent to the skilled artisan that there are many alterations that may be made in the apparatus and methods described without departing from the spirit and scope of the present invention. Wafers of many different sizes may be processes, for example, by changing certain elements of the chambers. process parameters may be accommodated in a wide variety of ways.

As a further example, there are many material substitutions that might be made in many elements of the present invention, such as for the material of the heater plate and for the susceptor. In view of the broad range of variations that may be made, the invention is limited only by the scope of the claims which follow:

What is claimed is:

1. An ALD processing station for a cluster tool system, comprising:

a processing chamber portion having a lower extremity with a first cross-sectional area;

a base chamber portion below the processing chamber portion, the base chamber portion having a vacuum pumping port and a substrate transfer port, and a second cross-sectional area below the lower extremity of the processing chamber greater than the first cross-sectional area;

a substrate support pedestal having an upper substrate support surface with a third cross-sectional area less than the first cross-sectional area and adapted to the base chamber portion below the transfer port by a dynamic vacuum seal allowing vertical translation;

a vertical-translation drive system adapted to translate the substrate support pedestal to place the upper support surface at a processing position substantially even with the lower extremity of the processing chamber, or at a lower transfer position in the base chamber portion above the pumping port and below the transfer port; and a demountable gas supply lid mounted to the processing chamber, the lid for providing gases according to an atomic layer deposition (ALD) protocol;

wherein, with the substrate support pedestal at the processing position and the base chamber portion form a first pumping passage having a first total effective area determining a first limited pumping speed from the processing chamber portion through the vacuum pumping port, and with the substrate support pedestal at the lower transfer position and the base chamber portion form a second annular pumping passage having a second effective area greater than the first effective area, allowing a second pumping speed from the processing chamber greater than the first limited pumping speed.

2. The processing chamber of claim 1 wherein the first cross-sectional area is formed by a replaceable ring, thereby allowing the first pumping speed to be incrementally varied by interchanging replaceable rings having constant outer diameter and differing inner diameter.

3. The processing chamber of claim 1 further comprising an annular shroud surrounding a portion of the substrate support pedestal beginning at the upper support surface and extending below the upper support surface, wherein the pumping area of the annular shroud at the height of the upper support surface is substantially equal to the first cross sectional area, such that, with the substrate support pedestal in the processing position the annular shroud mates with the base chamber portion constraining all gas flow from the processing chamber to flow within the annular shroud between the annular shroud and the substrate support pedestal.

4. The processing station of claim 1 wherein the demountable lid closing an upper extremity of the processing chamber is mounted with a demountable seal, such that the lid and the dynamic vacuum seal may be demounted, allowing the substrate support pedestal to be withdrawn from within the base chamber portion upward through the processing chamber portion.

5. The processing station of claim 4 wherein the demountable lid comprises a gas distribution system for providing processing gases evenly over an exposed surface of a substrate supported on the substrate support pedestal with the substrate support pedestal in the processing position.

6. The processing station of claim 1 wherein the substrate support pedestal comprises a closure plate parallel with the upper support surface and forming a vacuum boundary for the processing chamber, a heater plate on the processing chamber side thermally-insulated from the closure plate, and an electrically-isolated susceptor spaced-apart from and above the heater plate, the susceptor forming the upper support surface.

7. The processing station of claim 6 wherein the heater plate is a composite heater plate having at least two separately-powered heating regions, allowing temperature profile across the plate to be managed by managing power to the separately-powered regions.

8. The processing station of claim 7 wherein an inner heating region is separated from an outer heating region by at least one groove substantially through the heater plate.

9. The processing station of claim 7 wherein the inner heating region has a cross-sectional are substantially equal to a cross-sectional area of a substrate to be heated by the heater plate.

10. The processing station of claim 1 wherein the dynamic vacuum seal is a stainless steel bellows.

* * * * *